United States Patent
Lanting et al.

(10) Patent No.: US 11,856,871 B2
(45) Date of Patent: Dec. 26, 2023

(54) QUANTUM PROCESSORS

(71) Applicant: D-WAVE SYSTEMS INC., Burnaby (CA)

(72) Inventors: Trevor M. Lanting, Vancouver (CA); Danica W. Marsden, West Vancouver (CA); Byong Hyop Oh, San Jose, CA (US); Eric G. Ladizinsky, Manhattan Beach, CA (US); Shuiyuan Huang, Eagan, MN (US); J. Jason Yao, San Ramon, CA (US); Douglas P. Stadtler, Morgan Hill, CA (US)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 17/681,303

(22) Filed: Feb. 25, 2022

(65) Prior Publication Data

US 2022/0263007 A1  Aug. 18, 2022

Related U.S. Application Data

(63) Continuation of application No. 16/681,431, filed on Nov. 12, 2019, now abandoned.
(Continued)

(51) Int. Cl.
*H01L 39/02* (2006.01)
*H10N 60/80* (2023.01)
(Continued)

(52) U.S. Cl.
CPC ........... *H10N 60/805* (2023.02); *G06N 10/00* (2019.01); *H10N 60/0156* (2023.02);
(Continued)

(58) Field of Classification Search
CPC ............ H10N 60/805; H10N 60/0156; H10N 60/0912; H10N 60/12; H10N 69/00; G06N 10/00
See application file for complete search history.

(56) References Cited

U.S. PATENT DOCUMENTS

| 4,028,714 A | 6/1977 | Henkels |
| 4,454,522 A | 6/1984 | De |

(Continued)

FOREIGN PATENT DOCUMENTS

| CN | 1471180 A | 1/2004 |
| CN | 101088102 A | 12/2007 |

(Continued)

OTHER PUBLICATIONS

Racah et al., "Properties of normal metal/dielectric/high-Tc junctions obtained by in-situ oxidation", Physica C 263, 1996.
(Continued)

*Primary Examiner* — Jarrett J Stark
(74) *Attorney, Agent, or Firm* — Cozen O'Connor

(57) ABSTRACT

Systems and methods for fabricating a superconducting integrated circuit that includes wiring layers comprising low-noise material are described. A superconducting integrated circuit can be implemented in a computing system that includes a quantum processor. Such a superconducting integrated circuit includes a first set of one or more wiring layers that form a noise-susceptible superconducting device that can decrease processor when exposed to noise. The superconducting integrated circuit can further include a second set of one or more wiring layers that form a superconducting device that is less susceptible to noise. Fabricating a superconducting device that contains low-noise material can include depositing and patterning a wiring layer comprising a first material that is superconductive in a respective range of temperatures and depositing and pattern-
(Continued)

ing a different wiring layer comprising a second material that is superconductive in a respective range of temperatures. The second material can be considered a low-noise material.

18 Claims, 14 Drawing Sheets

Related U.S. Application Data

(60) Provisional application No. 62/760,253, filed on Nov. 13, 2018.

(51) Int. Cl.
  *G06N 10/00* (2022.01)
  *H10N 60/12* (2023.01)
  *H10N 60/01* (2023.01)
  *H10N 69/00* (2023.01)

(52) U.S. Cl.
  CPC ......... *H10N 60/0912* (2023.02); *H10N 60/12* (2023.02); *H10N 69/00* (2023.02)

(56) References Cited

U.S. PATENT DOCUMENTS

| | | |
|---|---|---|
| 4,490,733 A | 12/1984 | Kroger |
| 4,554,567 A | 11/1985 | Jillie et al. |
| 4,689,559 A | 8/1987 | Hastings et al. |
| 4,749,888 A | 6/1988 | Sakai et al. |
| 4,912,975 A | 4/1990 | Ohta et al. |
| 5,055,158 A | 10/1991 | Gallagher et al. |
| 5,084,438 A | 1/1992 | Matsubara et al. |
| 5,087,605 A | 2/1992 | Hegde et al. |
| 5,131,976 A | 7/1992 | Hoko |
| 5,157,466 A | 10/1992 | Char et al. |
| 5,250,817 A | 10/1993 | Fink |
| 5,274,249 A | 12/1993 | Xi et al. |
| 5,290,761 A | 3/1994 | Keating et al. |
| 5,307,068 A | 4/1994 | Hartemann |
| 5,323,344 A | 6/1994 | Katayama et al. |
| 5,323,520 A | 6/1994 | Peters et al. |
| 5,339,457 A | 8/1994 | Kawasaki et al. |
| 5,358,928 A | 10/1994 | Ginley et al. |
| 5,548,130 A | 8/1996 | Shimizu et al. |
| 5,627,139 A | 5/1997 | Chin et al. |
| 5,672,212 A | 9/1997 | Manos |
| 5,767,043 A | 6/1998 | Cantor et al. |
| 5,776,863 A | 7/1998 | Silver |
| 5,804,251 A | 9/1998 | Yu et al. |
| 5,846,846 A | 12/1998 | Suh et al. |
| 5,858,106 A | 1/1999 | Ohmi et al. |
| 5,863,868 A | 1/1999 | Chan et al. |
| 5,869,846 A | 2/1999 | Higashino et al. |
| 5,880,069 A | 3/1999 | Nakao et al. |
| 5,892,243 A | 4/1999 | Chan |
| 5,962,865 A | 10/1999 | Kerber et al. |
| 5,962,866 A | 10/1999 | DiIorio et al. |
| 6,011,981 A | 1/2000 | Alvarez et al. |
| 6,165,801 A | 12/2000 | Burns et al. |
| 6,188,919 B1 | 2/2001 | Lagraff et al. |
| 6,242,387 B1 | 6/2001 | Cukauskas et al. |
| 6,284,721 B1 | 9/2001 | Lee |
| 6,362,638 B1 | 3/2002 | Ashton et al. |
| 6,384,423 B1 | 5/2002 | Kerber et al. |
| 6,384,424 B1 | 5/2002 | Kugai et al. |
| 6,420,189 B1 | 7/2002 | Lopatin |
| 6,459,097 B1 | 10/2002 | Zagoskin |
| 6,476,413 B1 | 11/2002 | Jia et al. |
| 6,495,854 B1 | 12/2002 | Newns et al. |
| 6,517,944 B1 | 2/2003 | Puzey et al. |
| 6,541,789 B1 | 4/2003 | Sato et al. |
| 6,563,311 B2 | 5/2003 | Zagoskin |
| 6,569,252 B1 | 5/2003 | Sachdev et al. |
| 6,624,122 B1 | 9/2003 | Holesinger et al. |
| 6,627,915 B1 | 9/2003 | Ustinov et al. |
| 6,715,944 B2 | 4/2004 | Oya et al. |
| 6,753,546 B2 | 6/2004 | Tzalenchuk et al. |
| 6,767,840 B1 | 7/2004 | Uehara et al. |
| 6,803,599 B2 | 10/2004 | Amin et al. |
| 6,882,293 B2 | 4/2005 | Shoji et al. |
| 6,905,887 B2 | 6/2005 | Amin et al. |
| 6,979,836 B2 | 12/2005 | Zagoskin et al. |
| 7,091,132 B2 | 8/2006 | Tan et al. |
| 7,135,701 B2 | 11/2006 | Amin et al. |
| 7,418,283 B2 | 8/2008 | Amin |
| 7,533,068 B2 | 5/2009 | Maassen et al. |
| 7,619,437 B2 | 11/2009 | Thom et al. |
| 7,624,088 B2 | 11/2009 | Johnson et al. |
| 7,638,434 B2 | 12/2009 | Helneder |
| 7,639,035 B2 | 12/2009 | Berkley |
| 7,843,209 B2 | 11/2010 | Berkley |
| 7,876,248 B2 | 1/2011 | Berkley et al. |
| 7,898,282 B2 | 3/2011 | Harris et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,190,548 B2 | 5/2012 | Choi |
| 8,195,596 B2 | 6/2012 | Rose et al. |
| 8,283,943 B2 | 10/2012 | Van Den Brink et al. |
| 8,301,214 B1 * | 10/2012 | Tolpygo ............... H10N 60/805 505/190 |
| 8,421,053 B2 | 4/2013 | Bunyk et al. |
| 8,437,818 B1 | 5/2013 | Tolpygo et al. |
| 8,536,566 B2 | 9/2013 | Johansson et al. |
| 8,611,974 B2 | 12/2013 | Maibaum et al. |
| 8,644,898 B1 | 2/2014 | De Andrade et al. |
| 8,742,594 B2 | 6/2014 | Daubenspeck et al. |
| 8,854,074 B2 | 10/2014 | Berkley |
| 8,933,695 B1 | 1/2015 | Kornev et al. |
| 8,951,808 B2 | 2/2015 | Ladizinsky et al. |
| 9,130,116 B1 * | 9/2015 | Tolpygo .................. H01L 23/48 |
| 9,136,457 B2 | 9/2015 | Tolpygo |
| 9,183,508 B2 | 11/2015 | King |
| 9,355,362 B2 | 5/2016 | Shea et al. |
| 9,490,296 B2 * | 11/2016 | Ladizinsky ............ B82Y 10/00 |
| 9,495,644 B2 | 11/2016 | Chudak et al. |
| 9,520,180 B1 | 12/2016 | Mukhanov et al. |
| 9,564,573 B1 | 2/2017 | Chang et al. |
| 9,634,224 B2 | 4/2017 | Ladizinsky et al. |
| 9,768,371 B2 | 9/2017 | Ladizinsky et al. |
| 9,971,970 B1 | 5/2018 | Rigetti et al. |
| 9,978,809 B2 | 5/2018 | Ladizinsky et al. |
| 10,141,493 B2 | 11/2018 | Tuckerman |
| 10,454,015 B2 | 10/2019 | Lanting et al. |
| 10,528,886 B2 | 1/2020 | Boothby |
| 10,938,346 B2 | 3/2021 | Berkley et al. |
| 11,038,095 B2 | 6/2021 | Huang et al. |
| 11,105,866 B2 | 8/2021 | Swenson et al. |
| 11,127,893 B2 | 9/2021 | Johnson et al. |
| 11,295,225 B2 | 4/2022 | Hoskinson et al. |
| 2001/0020701 A1 | 9/2001 | Zagoskin |
| 2002/0017906 A1 | 2/2002 | Ho et al. |
| 2002/0117738 A1 | 8/2002 | Amin et al. |
| 2002/0180006 A1 | 12/2002 | Franz et al. |
| 2002/0188578 A1 | 12/2002 | Amin et al. |
| 2002/0190343 A1 | 12/2002 | Jones et al. |
| 2002/0190381 A1 | 12/2002 | Herr et al. |
| 2003/0027724 A1 | 2/2003 | Rose et al. |
| 2003/0068832 A1 | 4/2003 | Koval et al. |
| 2003/0089987 A1 | 5/2003 | Parikh |
| 2003/0102470 A1 | 6/2003 | Il et al. |
| 2003/0107033 A1 | 6/2003 | Tzalenchuk et al. |
| 2004/0077504 A1 | 4/2004 | Adachi et al. |
| 2004/0155237 A1 | 8/2004 | Kerber |
| 2004/0191697 A1 | 9/2004 | Nakatsuka et al. |
| 2004/0266209 A1 | 12/2004 | Hinode et al. |
| 2005/0029512 A1 | 2/2005 | Hato et al. |
| 2005/0062131 A1 | 3/2005 | Murduck et al. |
| 2005/0107261 A1 | 5/2005 | Cantor et al. |
| 2006/0197193 A1 | 9/2006 | Gu et al. |
| 2008/0001699 A1 | 1/2008 | Gardner et al. |

(56) References Cited

U.S. PATENT DOCUMENTS

| | | |
|---|---|---|
| 2008/0070325 A1 | 3/2008 | Tolpygo |
| 2009/0078931 A1 | 3/2009 | Berkley |
| 2009/0203192 A1 | 8/2009 | Kaltalioglu et al. |
| 2011/0022820 A1 | 1/2011 | Bunyk et al. |
| 2011/0065586 A1 | 3/2011 | Maibaum et al. |
| 2011/0089405 A1* | 4/2011 | Ladizinsky ............ B82Y 10/00 257/31 |
| 2012/0319211 A1 | 12/2012 | Van Dal et al. |
| 2013/0116159 A1 | 5/2013 | Pollard et al. |
| 2014/0111242 A1 | 4/2014 | Xie et al. |
| 2015/0032994 A1 | 1/2015 | Chudak et al. |
| 2015/0046681 A1 | 2/2015 | King |
| 2015/0119252 A1 | 4/2015 | Ladizinsky et al. |
| 2015/0119253 A1 | 4/2015 | Yohannes et al. |
| 2015/0219730 A1 | 8/2015 | Tsukamoto et al. |
| 2015/0236235 A1 | 8/2015 | Ladizinsky et al. |
| 2016/0079968 A1 | 3/2016 | Strand et al. |
| 2016/0170675 A1 | 6/2016 | Pickerell et al. |
| 2018/0053689 A1 | 2/2018 | Kirby et al. |
| 2018/0145631 A1 | 5/2018 | Berkley et al. |
| 2018/0219150 A1 | 8/2018 | Lanting et al. |
| 2018/0308896 A1 | 10/2018 | Ladizinsky et al. |
| 2018/0337138 A1 | 11/2018 | Luu et al. |
| 2019/0019099 A1 | 1/2019 | Hoskinson et al. |
| 2019/0044044 A1 | 2/2019 | Lampert et al. |
| 2019/0164959 A1 | 5/2019 | Thomas et al. |
| 2019/0288176 A1 | 9/2019 | Yoscovits et al. |
| 2019/0332965 A1 | 10/2019 | Barends |
| 2019/0369171 A1 | 12/2019 | Swenson et al. |
| 2020/0012961 A1 | 1/2020 | Kelly et al. |
| 2020/0144476 A1 | 5/2020 | Huang et al. |
| 2020/0152851 A1 | 5/2020 | Lanting et al. |
| 2020/0266234 A1 | 8/2020 | Boothby et al. |
| 2021/0190885 A1 | 6/2021 | Swenson et al. |
| 2021/0375516 A1 | 12/2021 | Sterling et al. |
| 2022/0123048 A1 | 4/2022 | Swenson et al. |
| 2023/0004851 A1 | 1/2023 | Harris et al. |

FOREIGN PATENT DOCUMENTS

| | | |
|---|---|---|
| CN | 102334206 A | 1/2012 |
| CN | 105914219 A | 8/2016 |
| EP | 0329603 A2 | 8/1989 |
| EP | 0437971 A1 | 7/1991 |
| EP | 046661 1 A1 | 1/1992 |
| EP | 0476844 A1 | 3/1992 |
| EP | 0477495 A1 | 4/1992 |
| EP | 0732756 A2 | 9/1996 |
| EP | 0756335 A1 | 1/1997 |
| EP | 2401776 B1 | 8/2016 |
| JP | S60140885 A | 7/1985 |
| JP | S6215869 A | 1/1987 |
| JP | S6257263 A | 3/1987 |
| JP | S62200777 A | 9/1987 |
| JP | 63007675 A | 1/1988 |
| JP | S637675 A | 1/1988 |
| JP | S63226981 A | 9/1988 |
| JP | S6411357 U | 1/1989 |
| JP | S6476610 A | 3/1989 |
| JP | H027583 A | 1/1990 |
| JP | H03286578 A | 12/1991 |
| JP | H04246871 A | 9/1992 |
| JP | H04334074 A | 11/1992 |
| JP | H05102547 A | 4/1993 |
| JP | H05114756 A | 5/1993 |
| JP | H06260692 A | 9/1994 |
| JP | H07066462 A | 3/1995 |
| JP | H07245404 A | 9/1995 |
| JP | H08236823 A | 9/1996 |
| JP | H104223 A | 1/1998 |
| JP | 2001516970 A | 10/2001 |
| JP | 2001516970T A | 10/2001 |
| JP | 2003092436 A | 3/2003 |
| JP | 2004-079882 | 3/2004 |
| JP | 2004079382 A | 3/2004 |
| JP | 2004519102 A | 6/2004 |
| JP | 2005-39244 A | 2/2005 |
| JP | 2005039244 A | 2/2005 |
| JP | 2007150257 A | 6/2007 |
| JP | 2009111306 A | 5/2009 |
| JP | 2012519379 A | 8/2012 |
| JP | 6059754 B2 | 12/2016 |
| KR | 20000026669 A | 5/2000 |
| KR | 20010067425 A | 7/2001 |
| KR | 20190035900 A | 4/2019 |
| WO | 99/14800 A1 | 3/1999 |
| WO | 9914800 A1 | 3/1999 |
| WO | 0201327 A2 | 1/2002 |
| WO | 02069411 A2 | 9/2002 |
| WO | 2005093649 A1 | 10/2005 |
| WO | 2007085074 A1 | 8/2007 |
| WO | 2008138150 A1 | 11/2008 |
| WO | 2009120638 A2 | 10/2009 |
| WO | 2009149086 A2 | 12/2009 |
| WO | 2013180780 A2 | 12/2013 |
| WO | 2016025598 A1 | 2/2016 |
| WO | 2016183213 A1 | 11/2016 |
| WO | 2017192733 A2 | 11/2017 |
| WO | 2018144601 A1 | 8/2018 |
| WO | 2019055002 A1 | 3/2019 |
| WO | 2019179732 A1 | 9/2019 |
| WO | 2020212437 A1 | 10/2020 |
| WO | 2021231224 A1 | 11/2021 |
| WO | 2021262741 A1 | 12/2021 |
| WO | 2022178130 A1 | 8/2022 |

OTHER PUBLICATIONS

Muller et al., "Towards understanding two-level-systems in amorphous solids—Insights from quantum circuits", arXiv:1705.01108v3, Oct. 10, 2019.

Makhlin et al., "Quantum-state engineering with Josephson-junction devices," Reviews of Modern Physics 73 (2):357-400, Apr. 2001.

Malissa et al., "Superconducting coplanar waveguide resonators for low temperature pulsed electron spin resonance spectroscopy", Review of Scientific Instruments, Feb. 1, 2013.

Martens et al., "Sparameter measurements on singe superconducting thin-film three-terminal devices made of high-Tc and low-Tc materials", J. Appl. Phys. 65, 1989.

Mason, "Surface Impedance of Thin Superconducting Films", California Institute of Technology, 1962.

McRae et al., "Materials loss measurements using superconducting microwave resonators", arXiv:2006.04718 [physics, physics:quant-ph], Sep. 1, 2000.

Mooij et al., "Josephson Persistent-Current Qubit," Science 285:1036-1039, Aug. 13, 1999.

Morton & Bertet, "Storing quantum information in spins and high-sensitivity ESR", Journal of Magnetic Resonance, 287:128-139, Feb. 1, 2018.

N/A, "Antifuse", Wikipedia, Nov. 16, 2019.

N/A, "Low-k dielectric", Wikipedia, Apr. 14, 2020.

Niepce et al., "Geometric scaling of two-level-system loss in superconducting resonators", Superconducting Science and Technology, 33(2):025013, Jan. 1, 2020.

NSA, "Superconducting Technology Assessment", National Security Agency Office of Corporate Assessments, Aug. 1, 2005, 257 pages.

Office Action in Application No. 2019-562235, dated Mar. 11, 2022 (English translation, 5 pages).

Oliver et al., "MRS Bulletin" vol. 38, pp. 816-825 (2013).

Peltonen, J.T., et al., "Hybrid rf SQUID qubit based on high kinetic inductance," Scientific Reports, Jul. 3, 2018, 8 pages.

Place et al., "New material platform for superconducting transmon qubits with coherence times exceeding 0.3 milliseconds", arXiv, Feb. 28, 2020.

Place et al., "Supplementary Materials for New material platform for superconducting transmon qubits with coherence times exceeding 0.3 milliseconds", Feb. 1, 2021.

(56) References Cited

OTHER PUBLICATIONS

Ramzi et al., "Niobium and Aluminum Josephson Junctions Fabricated with a Damascene CMP Process", Physics Procedia, vol. 36, 2012, p. 211-216.
Schulz et al., "Design and realization of an all d-wave dc pi-superconducting quantum interference device", Appl. Phys. Lett. 76, 2000.
Schuster et al., "High cooperativity coupling of electron-spin ensembles to superconducting cavities", Physical Review Letters, 105(14):140501, Sep. 1, 2010.
Sears, "Extending Coherence in Superconducting Qubits: from microseconds to milliseconds", PhD thesis, Yale, Jan. 1, 2013.
Sigillito et al., "Fast, low-power manipulation of spin ensembles in superconducting microresonators", Applied Physics Letters, 104(22):222407, Jun. 1, 2014.
Sun et al., "Direction of tunneling in Pb/ I /YBa2Cu3O7-x tunnel junctions", Phys Rev B 54, 1996.
Swenson et al., "Operation of a titanium nitride superconducting microresonator detector in the nonlinear regime," arXiv:1305.4281v1 [cond-mat.supr-con], May 18, 2013, 11 pages.
Tokunaga et al., "SiO2 passivation film effects on YBCO junctions", Science Direct, Sep. 10, 1998.
Tolpygo et al., "Advanced Fabrication Processes for Superconducting Very Large Scale Integrated Circuits," IEEE Transactions on Applied Superconductivity 26(3):1-10, Jan. 19, 2016.
Tolpygo et al., "Deep sub-micron stud-via technology of superconductor VLSI circuits," Supercond. Sci. Technol. 27:1-9, Jan. 14, 2014.
Valles et al., "Electron tunneling into single crystals of YBa2Cu3O7-δ", Phys. Rev. B 44, 1991.
Verjauw et al., "Investigation of microwave loss induced by oxide regrowth in high-Q Nb resonators", Physical Review Applied, p. 16, Jan. 1, 2020.
VLSI-expert.com, "Parasitic Interconnected Corner (RC corner) Basics—Part 1", hhtp:www.visi-expert.com/2012/02/parasitic-interconnected-corner-rc-corner.html, Feb. 12, 2012 (Year:2012), 7 pages.
Voesch et al., "On-Chip ESR Measurements of DPPH at mK Temperatures", Physics Procedia, 75:503-510, Jan. 1, 2015.
Voss et al., "Submicron Nb—Al-oxide-Nb junctions for frequency mixers", Superconductor Science and Technology 6, 1993.
Wallace & Silsbee, "Microstrip resonators for electron-spin resonance", Review of Scientific Instruments, 62 (7):1754-1766, Jul. 1, 1991.
Wang et al., "FTIR Characterization of Fluorine Doped Silicon Dioxide Thin Films Deposited by Plasma Enhanced Chemical Vapor Deposition", IOP Science, Apr. 21, 2000.
Weichselbaumer et al., "Quantitative modeling of superconducting planar resonators with improved field homogeneity for electron spin resonance", Physical Review Applied, 12(2):024021, Aug. 1, 2019.
Winkel, "Implementation of a transmon qubit using superconducting granular aluminum", arXiv, Nov. 7, 2019.
Woods et al., "Determining interface dielectric losses in superconducting coplanar waveguide resonators", arXiv:1808.10347 [cond-mat,physics:quant-ph], Aug. 1, 2018.
Written Opinion for PCT/US2018/016237, dated Jul. 2, 2018, 30 pages.
Written Opinion for PCT/US2020/018137, dated Jun. 3, 2020, 10 pages.
Tolpygo, Sergey K., et al., "Superconductor Electronics Fabrication Process with MoNx Kinetic Inductors and Self-Shunted Josephson Junctions," IEEE Transactions on Applied Superconductivity 28(4), Jun. 2018, 12 pages.
Whittaker, J.D. , et al., "A frequency and sensitivity tunable microresonator array for high-speed quantum," arXiv:1509.05811v2 [quant-ph], Apr. 22, 2016, 8 pages., Apr. 22, 2016.
Anlage , et al., "A current controlled variable delay superconducting transmission line", IEEE, pp. 1388-1391.
Berkley , et al., "A scalable readout system for a superconducting adiabatic quantum optimization system", arXiv, May 6, 2009, 18 pages.
Dagan , et al., "Absence of Andreev reflections and Andreev bound states above the critical temperature", Phys. Rev. B 61, 2000, 5 pages.
Eom , et al., "A Wideband, Low-Noise Superconducting Amplifier with High Dynamic Range", arXiv, Jan. 11, 2012, 23 pages.
Kerber, et al., "An improved NbN integrated circuit process featuring thick NbN ground plane and lower parasitic circuit inductances", IEEE, Jun. 1997, 6 pages.
Lisitskii , et al., "Annular Josephson junctions for radiation detection: fabrication and investigation of the magnetic behavior", Nuclear Instruments & Methods in Physics Research, Apr. 2000, 11 pages.
Macco , et al., "Atomic-layer deposited Nb2O5 as transparent passivating electron contact for c-Si solar cells", Science Direct, Sep. 2018, 7 pages.
Nicoletti , et al., "Bi-epitaxial YBCO grain boundary Josephson junctions on SrTiO3 and sapphire substrates", Physica C 269, 1996, 13 pages.
Tolpygo , et al., "Advanced Fabrication Processes for Superconducting Very Large-Scale Integrated Circuits", IEEE, Jan. 19, 2016.
Yoon , et al., "Atomic-scale chemical analyses of niobium oxide/niobium interfaces via atom-probe tomography", AIP Applied Physics Letters, Oct. 2, 2008, 3 pages.
Blanquart et al. , et al., "Evaluation and Comparison of Novel Precursors for Atomic Layer Deposition of Nb2O5 Thin Films", Chem. Mater., Feb. 8, 2012, 6 pages.
Born, et al., "Fabrication of Ultrasmall Tunnel Junctions by Electron Beam Direct-Writing", IEEE, 2001, 4 pages.
Buchholz, et al., "LTS junction technology for RSFQ and qubit circuit applications", Science Direct, Jul. 24, 2006, 8 pages.
Campbell , et al., "Dynamics of Oxidation of Aluminum Nanoclusters using Variable Charge Molecular-Dynamics Simulations on Parallel Computers", APS Physics, Jun. 14, 1999, 4 pages.
Chan , et al., "Interface between gold and superconducting YBa2Cu3O7-x", J. Mater. Res, 1995, 6 pages.
Cucolo , et al., "Linear normal conductance in copper oxide tunnel junctions", Phys. Rev. B 54, 1996, 3 pages.
Dagan , et al., "C-axis tunneling on YBCO films", Eur. Phys. J. B 19, 2001, 5 pages.
Dimos , et al., "Orientation Dependence of Grain-Boundary Critical Currents in YBa2Cu3O7 Biocrystals", Physical Review Letters, Jul. 11, 1988, 5 pages.
Dolata , et al., "Platinum thin film resistors with Cr under- and overlayers for Nb/Al2O3/Nb technology", Science Direct, Jul. 19, 2005, 4 pages.
Faucher , et al., "Niobium and niobium nitride SQUIDs based on anodized nanobridges made with an atomic force microscope", Science Direct, Mar. 1, 2002, 7 pages.
Geerlings , et al., "Improving the Quality Factor of Microwave Compact Resonators by Optimizing their Geometrical Parameters", Applied Physics Letters, 2012, 4 pages.
Grabert , et al., "Mesoscopic Josephson effect", Superlattices and Microstructures 25, 2019, 10 pages.
Grünhaupt , et al., "Granular aluminum: A superconducting material for high impedance quantum circuits", arXiv, Sep. 27, 2018, 9 pages.
Grünhaupt, et al., "Quasiparticle dynamics in granular aluminum close to the superconductor to insulator transition", arXiv, Feb. 7, 2018.
Hadfield , et al., "Novel Josephson junction geometries in NbCu bilayers fabricated by focused ion beam microscope", Physica C, North-Holland Publishing, Amsterdam, Feb. 15, 2002, 9 pages.
Harris , "Improved coherence leads to gains in quantum annealing performance", D-Wave, 2019, 4 pages.
Havemann, et al., "High-performance interconnects: an integration overview", IEEE, May 2001, 16 pages.
Herr , et al., "Reproducible Operating Margins on a 72,800-Device Digital Superconducting Chip", arXiv, Oct. 5, 2015, 6 pages.
Hilgenkamp , et al., "Implications of dx2-y2 symmetry and faceting for the transport properties of grain boundaries in high-TC superconductors", Physical Review B 53, 1996, 8 pages.

(56) References Cited

OTHER PUBLICATIONS

Hinode, et al., "Fabrication of reliable via conductors for niobium SFQ devices", Science Direct, Jul. 19, 2005, 8 pages.
Hypres, "Niobium Integrated Circuit Fabrication Process #S45/100/200 Design Rules", Hypres, Mar. 10, 2015, 9 pages.
Iguchi, et al., "Experimental evidence for a d-wave pairing state in YBa2Cu3O7-y from a study of YBa2Cu3O7-y/ insulator/Pb Josephson tunnel junctions", Phys. Rev. B 49, 1994, 4 pages.
Il'Ichev, et al., "Nonsinusoidal Current-Phase Relationship of Grain Boundary Josephson junctions in High-Tc Superconductors", Physical Review Letters 81, 1998, 4 pages.
Joyez, et al., "Observation of Parity-Induced Suppression of Josephson Tunneling in the Superconducting Single Electron Transistor", Phys. Rev., Lett. 72, Jul. 19, 2005, 5 pages.
Koelle, et al., "High-transition-temperature superconducting quantum interference devices", Reviews of Modern Physics 71, 199, 56 pages.
Kohl, "Low-Dielectric Constant Insulators for Future Integrated Circuits and Packages", Georgia Tech, Mar. 14, 2011, 25 pages.
Kouznetsov, et al., "c-axis Josephson Tunneling between YBa2Cu3O7-δ and Pb: Direct Evidence for Mixed Order Parameter Symmetry in a High-Tc Superconductor", Phys. Rev. Lett. 79, 1997, 4 pages.
Kubatkin, et al., "Coulomb blockade electrometer with a high-Tcisland", JETP Letters 63, 1996, 7 pages.
Levinsen, "Electromagnetic properties of the Dayem bridge", HAL Archives, Jan. 1, 1974, 11 pages.
Maleeva, et al., "Circuit Quantum Electrodynamics of Granular Aluminum Resonators", arXiv, Feb. 7, 2018, 17 pages.
Martinis, et al., "Critical Field for Complete Vortex Expulsion from Narrow Superconducting Strips", UCSB, Mar. 5, 2004, 4 pages.
Matveev, et al., "Parity-Induced Suppression of the Coulomb Blockade of Josephson Tunneling", Phys. Rev. Lett. 70, 1993, 4 pages.
McKenney, et al., "Design considerations for a background limited 350 micron pixel array using lumped element superconducting microresonators", SPIE, Sep. 24, 2012, 10 pages.
Nagasawa, et al., "Development of advanced Nb process for SFQ circuits", Science Direct, Jun. 9, 2004, 8 pages.
Potts, et al., "CMOS compatible fabrication methods for submicron Josephson junction qubits" IEEE, Sep. 5, 2001, 4 pages.
Russo, et al., "Characterization of Superconducting Thin Films and nanoSQUIDs for Nanoparticle Investigation at High Magnetic Field", IEEE, Feb. 18, 2012, 4 pages.
Satoh, et al., "Fabrication process of planarized multi-layer Nb integrated circuits", IEEE, Jun. 13, 2005, 4 pages.
Satoh, et al., "Planarization of Josephson junctions for large-scale integrated Nb SFQ circuits by mechanical polishing", Science Direct, 1999, 4 pages.
Tafuri, et al., "Feasibility of Biepitaxial YbaCuO Josephson Junctions for Fundamental Studies and Potential Circuit Implementation", Los Alamos National Laboratory preprint server condmat, Dec. 18, 2002, 21 pages.
Tolpygo, et al., "Deep Sub-Micron Stud-via Technology for Superconductor VLSI Circuits", IOP Science, Jan. 14, 2014, 10 pages.
Tsuei, et al., "Pairing symmetry in cuprate superconductors", Reviews of Modern Physics 72, 2000, 48 pages.
Valenti, et al., "Interplay between kinetic inductance, non-linearity and quasiparticle dynamics in granular aluminum MKIDs", arXiv, Nov. 10, 2018, 14 pages.
Van Harlingen, "Phase-sensitive tests of the symmetry of the pairing state in the high-temperature superconductors—Evidence for dx2-y2 symmetry", Rev. Mod. Phys. 67, 1995, 23 pages.
Vinante, et al., "Hot-electron effect in palladium thin films", APS Physics, Mar. 13, 2007, 5 pages.
Wen, et al., "Microstructure of ramp-edge Yba2Cu3O3/PrBa2Cu3O2 Josephson junctions on different substrates", Physica C 255, 1995, 13 pages.
Wollman, et al., "Evidence for dx2-y2 Pairing from the Magnetic Field Modulation of YBa2Cu3O7-Pb Josephson Junctions". Phys. Rev. Lett 74, Jan. 30, 1995, 4 pages.

Yohannan, "Characterization of alpha and beta phases of tantalum coatings", New Jersey Institute of Technology, Aug. 31, 2001, 107 pages.
Zantye, Parshuram B, et al., "Chemical mechanical planarization for microelectronics application", Materials Science and Engineering R 45 (2004) 89-220. 2004 (Year: 2004), 132 pages.
Barends, et al., "Superconducting quantum circuits at the surface code threshold for fault tolerance", Nature vol. 508, pp. 500-503 (2014).
Blatter et al., "Design aspects of superconducting-phase quantum bits," Physical Review B 63: 174511-1-174511-9, 2001.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Calusine et al., "Analysis and mitigation of interface losses in trenched superconducting coplanar wave resonators", Applied Physics Letters, 112(6):062601, Feb. 1, 2018.
Cava, et al., "Electrical and magnetic properties of Nb2O5- crystallographic shear structures", Phys. Rev. B44, 6973—Published Oct. 1, 1991.
Clauss et al., "Broadband electron spin resonance from 500 MHz to 40 GHz using superconducting coplanar waveguides", Applied Physics Letters, Apr. 1, 2013.
Clauss et al., "Optimization of Coplanar Waveguide Resonators for ESR Studies on Metals", Journal of Physics: Conference Series, Mar. 1, 2015.
Daalmans, "HTS DC SQUIDs for practical applications", Science Direct, Jul. 1, 1995.
De Graaf et al., "Direct Identification of Dilute Surface Spins on Al2O3: Origin of Flux Noise in Quantum Circuits", Physical Review Letters, Jan. 1, 2017.
De Graaf et al., "Suppression of low-frequency charge noise in superconducting resonators by surface spin desorption", Nature Communications, 9(1):1143, Dec. 1, 2018.
Diniz et al., "Intrinsic photon loss at the interface of superconducting devices", arXiv, Mar. 10, 2020.
Doerner, S., et al., "Compact microwave kinetic inductance nanowire galvanometer for cryogenic detectors at 4.2 K," J. Phys. Commun., 2018, 8 pages.
Extended European Search Report for EP 18747998.5, dated Sep. 3, 2020, 8 pages.
Friedrich et al., "Onset of phase diffusion in high kinetic inductance granular aluminum micro-SQUIDs", arXiv, Aug. 29, 2019.
Gao et al., "Experimental evidence for a surface distribution of two-level systems in superconducting lithographed microwave resonators", Applied Physics Letters, 92(15):152505, Apr. 1, 2018.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hinode et al., "Fabrication of reliable via conductors for niobium SFQ devices," Physica C 426-431:1533-1540, 2005.
Holzman et al., "On-chip integrable planar NbN nanoSQUID with broad temperature and magnetic-field operation range", AIP Advances, Oct. 23, 2019.
Hori et al., "Electron spin resonance study on pure single crystalline sapphire", P hys. Status Solidi C 10, No. 12, 1681-1683 (Nov. 5, 2013).
Hunt et al., "NbN/MgO/NbN edge-geometry tunnel junctions", Applied Physics Letters 55, 1982.
International Search Report for PCT/US2018/016237, dated Jul. 2, 2018, 6 pages.
International Search Report for PCT/US2020/018137, dated Jun. 3, 2020, 4 pages.
Japanese Office Action for Japanese Patent Application No. 2020-073654, dated Aug. 17, 2021 (with English Translation) 5 pages.
Johnson et al., "Scalable Control System for a Superconducting Adiabatic Quantum Optimization Processor," Superconductor Science & Technology (2010).
Kwon et al., "Magnetic Field Dependent Microwave Losses in Superconducting Niobium Microstrip Resonators", Journal of Applied Physics, 124(3):033803, Jul. 1, 2018.

(56) References Cited

OTHER PUBLICATIONS

Lanting et al., "Evidence for temperature-dependent spin diffusion as a mechanism of intrinsic flux noise in SQUIDs", Physical Review B 89, 014503 (Jan. 7, 2014).
Lanting et al., "Geometrical dependence of the low-frequency noise in superconducting flux qubits", Physical Review B, 79, 060509, Jun. 5, 2009, 4 pages.
Levy-Bertrand et al., "Electrodynamics of granular aluminum from superconductor to insulator: observation of collective superconducting modes", arXiv, Mar. 13, 2019.
Lomatch et al., "Multilayer Josephson Flux Quantum Devices," IEEE Trans. Appl. Superconductivity, vol. 5, No. 2, Jun. 2, 1995.
Lucero, "Computing prime factors using a Josephson phase-qubit architecture: 15=3x5", A dissertation submitted in partial satisfaction of the requirements for the degree of Doctor of Philosophy in Physics, University of California Santa Barbara.
Il'ichev, et al. "Degenerate ground state in a mesoscopic YBa2Cu3O7-x grain boundary Josephson junction", Physical Review Letters, vol. 86, No. 23, Jun. 4, 2001, 4 pages.
Annunziata, et al., "Tunable superconducting nanoinductors", IOP Science, Oct. 15, 2010, 11 pages.
Balashov, et al., "Superconductor-insulator-normal- conductor-insulator-superconductor process development for integrated circuit applications", IOP Science, Dec. 1, 1998, 11 pages.
Bruder, et al., "Tunnel junctions of Unconventional Superconductors", Physical Review, 1995, 5 pages.
Larsson, et al., "Transport properties of submicron YBa2Cu3O7-d step-edge Josephson junctions", J. Appl. Phys. 90, 2001, 24 pages.
Lombardi, et al., "Tunnel barriers for an all-high-Tc single electron tunneling transistor", Physica C 368, 2002, 6 pages.
Martinis, et al., "UCSB final report for the CSQ program: Review of decoherence and materials physics for superconducting qubits", arXiv, Oct. 21, 2014, 10 pages.
Mazin, et al., "Thin film dielectric microstrip kinetic inductance detectors", arXiv, Feb. 1, 2010, 10 pages.
Ortlepp, et al., "RSFQ Circuitry Using Intrisic π-Phase Shifts", IEEE, Jun. 2007, 5 pages.
Schrieffer, et al., "Superconductivity", Rev. Mod. Phys., 71, 1999, 5 pages.
Sigrist, et al., "Unusual paramagnetic phenomena in granula high-temperature superconductors—A consequence of d-wave pairing?", Rev. Mod. Phys. 67, 1995, 5 pages.
Smilde, et al., "Y—Ba—Cu—O / Au / Nb Ramp-type Josephson Junctions", IEEE, 2001, 5 pages.
Tanaka, et al., "Theory of Josephson effects in anisotropic superconductor", Physical Review B 56, 1997, 21 pages.
Tolpygo, "Superconductor Digital Electronics: Scalability and Energy Efficiency Issues", arXiv, Feb. 10, 2016, 20 pages.
Tosi, et al., "Silicon quantum processor with robust long-distance qubit couplings", Nature, Sep. 6, 2017, 11 pages.
D-Wave Whitepaper, Early Progress on Lower Noise, 2022.
Fritzsch et al., "SNS and SIS Josephson junctions with dimensions down to the sub-μm region prepared by an unified technology," Supercond. Sci. Tech. 12: 880-882, 1999.
Gao et al., A Semiempirical Model for Two Level System Noise In Superconducting Microresonators, Applied Physics, 2008.
International Search Report and Written Opinion, dated Oct. 13, 2021. for PCT/US2021/038519, 9 pages.
Kauppinen, et al., "Coulomb Blockade Thermometer: Tests and Instrumentation", Review of Scientific Instruments, vol. 69, #12, 1998.
Kosen, et al., "Building Blocks of a Flip Chip Integrated Superconducting Quantum Processor", arXiv 2112.02717v2, 2022.
Lee, "The Feasibility of Au Bonding on SN-Plated Cu", Journal of Electronic Materials, 2007.
Logothetidis, et al., "Room Temperature Oxidation Behavior of TiN Thin Films", 1999.
Luo, "Superconductivity In Noble-Metal-Rich Hexagonal Close-Packed Phases", 1970.
McCrory, et al., "Wafer-Level Electrically Detected Magnetic Resonance: Magnetic Resonance In a Probing Station", 2018.
Mcintyre, "The Effect of Annealing and Heating Deposition on Alpha and Beta Phase Formation for Tantalum Thin Films", 2018.
Narkowicz, et al., "Planar Microresonators for EPR Experiments", Science Direct, 2005.
Ni, et al., "Demonstration of Tantalum as a Structural Material for MEMS Thermal Actuators", 2021.
Non-Final Office Action Issued in U.S. Appl. No. 16/870,537, dated Jul. 19, 2023, 9 pages.
Shoji et al., "New fabrication process for Josephson tunnel junctions with (niobium nitride, niobium) double-layered electrodes," Appl. Phys. Lett. 41(11): 1097-1099, Dec. 1, 1982.
Veinger, "Technique for Magnetic Susceptibility Determination in the High Doped Semiconductors by Electron Spin Resonance", 2013.
Vladoiu, "Growth and Characteristics of Tantalum Oxide Thin Films Deposited Using Thermionic Vacuum Arc Technology", 2010.
Wang, "Towards Practical Quantum Computers: Transmon Qubit With a Lifetime Approaching 0.5 Milliseconds", 2022.
Zednicek, "Niobium and Niobium Oxide Capacitors Overview", 2019.
Zhang, et al., "Characterization of Surface Oxidation Layers On Ultrathin NvTiN Films", 2018.
Chinese Office Action dated Mar. 30, 2023, for Chinese Application No. 201880021010X, 12 pages (English translation of action).

* cited by examiner

QUANTUM PROCESSORS

FIELD

This disclosure generally relates to quantum processors, and in particular, relates to quantum processors that include a set of wiring layers comprising more than one type of material to reduce noise in superconductive devices and a base electrode that has been planarized.

BACKGROUND

Superconductive Processor

A quantum processor may take the form of a superconducting processor. However, superconductive processors can include processors that are not intended for quantum computing. For instance, some embodiments of a superconductive processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Superconducting Qubits

Superconducting qubits are a type of superconducting quantum device that can be included in a superconducting integrated circuit. Superconducting qubits can be separated into several categories depending on the physical property used to encode information. For example, they may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed. Superconducting qubits commonly include at least one Josephson junction. A Josephson junction is a small interruption in an otherwise continuous superconducting current path and is typically realized by a thin insulating barrier sandwiched between two superconducting electrodes. Thus, a Josephson junction is usually formed as a three-layer or "trilayer" structure. Superconducting qubits are further described in, for example, U.S. Pat. Nos. 7,876,248, 8,035,540, and 8,098,179.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce complementary metal-oxide-semiconductor (CMOS) wafers in a semiconductor facility.

Superconductor fabrication has typically been performed in research environments where standard industry practices could be optimized for superconducting circuit production. Superconducting integrated circuits are often fabricated with tools that are traditionally used to fabricate semiconductor chips or integrated circuits. Due to issues unique to superconducting circuits, not all semiconductor processes and techniques are necessarily transferrable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce noise wherever possible.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration. The typical reactor consists of a vacuum reactor chamber made usually of aluminum, glass, or quartz. A radiofrequency or microwave energy source (referred to collectively as RF energy source) is used to activate etchants, for example, fluorine-based or chlorine-based gases. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system removes dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Ion beam etching and milling are physical etching processes which use a beam of low-energy ions to dislodge material. The ion beam is extracted from an ionized gas (e.g., argon or argon/oxygen) or plasma, created by an electrical discharge.

Reactive-ion etching (RIE) is a combination of chemical and physical etching. During RIE, a wafer is placed in a chamber with an atmosphere of chemically reactive gas (e.g., $CF_4$, $CCl_4$ and many other gases) at a low pressure. An electrical discharge creates an ion plasma with an energy of a few hundred electron volts. The ions strike the wafer surface vertically, where they react to form volatile species that are removed by the low pressure in-line vacuum system.

Planarization

The use of chemical-mechanical planarization (CMP) allows for a near flat surface to be produced. CMP is a standard process in the semiconductor industry. The CMP process uses an abrasive and corrosive chemical slurry in conjunction with a polishing pad and retaining ring that are pressed together by a dynamic polishing head. The dynamic polishing head is rotated with different axes of rotation (i.e., not concentric). This removes material and tends to even out any irregular topography, making the wafer flat or planar. The chemicals in the slurry also react with and/or weaken the material to be removed such that certain materials can be preferentially removed while leaving others relatively intact. The abrasive accelerates this weakening process and the polishing pad helps to wipe the reacted materials from the surface. Advanced slurries can be used to preferentially remove areas of the wafer which are relatively high or protrude in relation to areas of the wafer which are relatively low in order to planarize the topography of the wafer.

Hamiltonian Description of a Quantum Processor

In accordance with some embodiments of the present systems and devices, a quantum processor may be designed to perform adiabatic quantum computation and/or quantum annealing. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N}h_i\sigma_i^z + \sum_{j>i}^{N}J_{ij}\sigma_i^z\sigma_j^z\right] \quad (1)$$

where N represents the number of qubits, $\sigma_i^z$ is the Pauli z-matrix for the $i^{th}$ qubit, $h_i$ and $J_{i,j}$ are dimensionless local fields for the qubits, and couplings between qubits, and $\varepsilon$ is some characteristic energy scale for $H_P$. Here, the $\sigma_i^z$ and $\sigma_i^z\sigma_j^z$ terms are examples of "diagonal" terms. The former is a single qubit term and the latter a two qubit term. Hamiltonians may be physically realized in a variety of different ways, for example, by an implementation of superconducting qubits.

Noise in a Quantum Processor

Low-noise is a desirable characteristic of quantum devices. Noise can compromise or degrade the functionality of the individual devices, such as superconducting qubits, and of the superconducting processor as a whole. Noise can negatively affect qubit coherence and reduce the efficacy of qubit tunneling. Since noise is a serious concern to the operation of quantum processors, measures should be taken to reduce noise wherever possible so that a transition from coherent to incoherent tunneling is not induced by the environment.

Impurities may be deposited on the metal surface and/or may arise from an interaction with the etch/photoresist chemistry and the metal. Noise can be caused by impurities on the upper surface of the quantum processor. In some cases, superconducting devices that are susceptible to noise are fabricated in the top wiring layers of a superconducting integrated circuit and are thus sensitive to post-fabrication handling. There is a risk of introducing impurities that cause noise during post-fabrication handling. One approach to reducing noise is using a barrier passivation layer, for example, an insulating layer, to overlie the topmost wiring layer. The use of a barrier passivation layer to minimize noise from impurities on the upper surface of a quantum processor is described in U.S. Pat. No. 10,454,015.

Noise can also result from an external environment or surrounding circuitry in a superconducting processor. In a quantum processor, flux noise on qubits interferes with properly annealing the quantum processor because of the steep transition between qubit states as the flux bias is swept. Flux noise can be a result of current flowing through wiring of other devices included in the superconducting processor and can have a particularly negative effect on qubits at their respective degeneracy points. For example, flux noise can introduce errors in calculations carried out by the superconducting processor due to inaccuracies in setting flux bias and coupling strength values. Such values are important to using an integrated circuit as part of a quantum processor. Much of the static control error can be designed out of the processor with careful layout and high-precision flux sources, as well as by adding circuitry, such as an on-chip shield, to tune away any non-ideal flux qubit behavior. However, in many cases, limitations in integrated circuit fabrication capabilities can make it difficult to address noise by changing processor layout and adding circuitry. There is thus a general desire for systems and methods to for fabricating integrated circuits that have reduced flux noise without having to compromise the quantum processor layout by adding additional layers or circuitry.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need for scalable systems and methods for fabricating integrated circuits that have reduced flux noise. Past approaches necessitate additional layers, such as overlying passivation layers, or additional circuitry such as on chip shields. The present systems and methods describe fabrication of a superconducting integrated circuit including fabrication of a superconducting integrated circuit with low-noise layers.

A method for fabricating a superconducting integrated circuit may be summarized as including: depositing a first wiring layer comprising a first material that is superconductive in a first range of temperatures, the first range of temperatures including a respective critical temperature; patterning the first wiring layer to form a first set of one or more superconducting traces; depositing a first dielectric layer; polishing the first dielectric layer back to an upper surface of the first wiring layer; depositing a passivation layer to overlie at least a portion of the first wiring layer, the passivation layer comprising a second material that is superconductive in a second range of temperatures, the second range of temperatures including a respective critical temperature; patterning the passivation layer; depositing a second dielectric layer to overlie at least a portion of the passivation metal layer; patterning the second dielectric layer to expose at least a portion of the passivation layer; depositing a second wiring to overlie at least a portion of the passivation layer, the second wiring layer comprising the second material that is superconductive in the second range of temperatures; forming a first set of vias electrically coupling the second wiring layer to the passivation layer, the first set of vias comprising the second material that is superconductive in the second range of temperatures; and patterning the second wiring layer to form a second set of one or more superconducting traces. a first wiring layer including a first set of one or more superconducting traces, the first wiring layer comprising a first material that is superconductive in a first range of temperatures; a passivation layer overlying the first wiring layer, the passivation layer comprising a second material that is superconductive in a second range of temperatures; a second wiring layer including a second set of one or more superconducting traces, the second wiring layer comprising the second material that is superconductive in the second range of temperatures; a first set of vias electrically coupling the passivation layer to the second wiring layer, the first set of vias comprising the second material that is superconductive in the second range of temperatures; a third wiring layer including a third set of one or more superconducting traces, the third wiring layer comprising the second material that is superconductive in the second range of temperatures; and a second set of vias electrically coupling the second wiring layer to the third wiring layer, the second set of vias comprising the second material that is superconductive in the second range of temperatures.

Depositing the first wiring layer may include depositing the first wiring layer comprising the first material that is superconductive at a respective critical temperature that is different from a respective critical temperature of the second range of temperatures. a first wiring layer including a first set of one or more superconducting traces, the first wiring layer comprising a first material that is superconductive in a first range of temperatures; a passivation layer overlying the first wiring layer, the passivation layer comprising a second material that is superconductive in a second range of temperatures; a second wiring layer including a second set of one or more superconducting traces, the second wiring layer comprising the second material that is superconductive in the second range of temperatures; a first set of vias electrically coupling the passivation layer to the second wiring layer, the first set of vias comprising the second material that is superconductive in the second range of temperatures; a third wiring layer including a third set of one or more superconducting traces, the third wiring layer comprising the second material that is superconductive in the second range of temperatures; and a second set of vias electrically coupling the second wiring layer to the third wiring layer, the second set of vias comprising the second material that is superconductive in the second range of temperatures.

The method may further include polishing the second dielectric layer back to an upper surface of the passivation metal layer and re-depositing the second dielectric layer, after depositing the second dielectric layer to overlie at least a portion of the passivation metal layer. The method may further include depositing a third dielectric layer to overlie at least a portion of the second wiring layer. The method may further include polishing the third dielectric layer back to the upper surface of the second wiring layer and re-depositing the third dielectric layer.

The method may further include patterning the third dielectric layer to expose at least a portion of the second wiring layer. The method may further include depositing a third wiring layer to overlie the third dielectric layer, the third wiring layer comprising the second material that is superconductive in the second range of temperatures. The method may further include patterning the third wiring layer to form a third set of one or more superconducting traces. The method may further include forming a second set of vias electrically coupling the third wiring layer to the second wiring layer, the second set of vias comprising the second material that is superconductive in the second range of temperatures.

Depositing a first wiring layer may include depositing the first wiring layer to overlie an additional wiring layer, the additional wiring layer comprising the first material that is superconductive in the first range of temperatures. Patterning the first wiring layer to form a first set of one or more superconducting traces may include patterning the first wiring layer to form at least one of: a magnetometer, a transformer, at least a portion of an on-chip shield. Patterning the second wiring layer to form a second set of one or more superconducting traces may include patterning the second wiring layer to form at least one of: a qubit and a coupler.

A superconducting integrated circuit may be summarized as including: a first wiring layer including a first set of one or more superconducting traces, the first wiring layer comprising a first material that is superconductive in a first range of temperatures; a passivation layer overlying the first wiring layer, the passivation layer comprising a second material that is superconductive in a second range of temperatures; a second wiring layer including a second set of one or more superconducting traces, the second wiring layer comprising the second material that is superconductive in the second range of temperatures; a first set of vias electrically coupling the passivation layer to the second wiring layer, the first set of vias comprising the second material that is superconductive in the second range of temperatures; a third wiring layer including a third set of one or more superconducting traces, the third wiring layer comprising the second material that is superconductive in the second range of temperatures; and a second set of vias electrically coupling the second wiring layer to the third wiring layer, the second set of vias comprising the second material that is superconductive in the second range of temperatures.

The first range of temperatures and the second range of temperatures may each include a respective critical temperature, and the critical temperature of the first range of temperatures is higher than the critical temperature of the second range of temperatures. The first material may be or may include niobium. The second material may be or may include aluminum.

The superconducting integrated circuit may include a substrate and a trilayer Josephson junction, the substrate carrying: the trilayer Josephson junction, the first wiring layer, the passivation layer, the second wiring layer, the first set of vias, the third wiring layer, and the second set of vias.

The superconducting integrated circuit may further includes a fourth wiring layer and a third set of vias each overlying the trilayer Josephson junction, the third set of vias electrically coupling the trilayer Josephson junction to the fourth wiring layer. The superconducting integrated circuit may further include a fifth wiring layer and a fourth set of vias each overlying the fourth wiring layer, the fourth set of vias electrically coupling the fourth wiring layer to the fifth wiring layer.

The superconducting integrated circuit may further include a first dielectric layer interposed between the passivation layer and the second wiring layer, the first dielectric layer comprising silicon dioxide. The superconducting integrated circuit may even further include a second dielectric layer interposed between the second wiring layer and the third wiring layer, the second dielectric layer comprising silicon dioxide. The first wiring layer may be thicker than the passivation layer.

The first set of one or more superconducting traces may advantageously form at least a portion of an on-chip shield. The first set of one or more superconducting traces may form at least a portion of a magnetometer. The second set of one or more superconducting traces may form at least a portion of a noise-susceptible device. The second set of one or more superconducting traces may form at least one qubit. The second set of one or more superconducting traces may form at least one coupler. The second set of one or more superconducting traces may form at least a portion of a noise-susceptible device. The third set of one or more superconducting traces may form at least one qubit. The third set of one or more superconducting traces may form at least one coupler.

A method for fabricating a superconducting integrated circuit may be summarized as including: depositing a base electrode layer, the base electrode layer comprising a deposited top surface having a first roughness; planarizing the base electrode layer, the base electrode layer subsequently comprising a planarized top surface having a second surface roughness, the second surface roughness being less than the first surface roughness; depositing an insulating layer to overly at least a portion of the planarized top surface of the base electrode layer; and depositing a counter electrode layer to overly at least a portion of the insulating layer.

Planarizing the base electrode layer may comprise a chemical-mechanical planarization process, and planarizing the base electrode layer may comprise planarizing the base electrode layer such that the planarized top surface of the base electrode layer is atomically smooth.

The method may further include patterning the base electrode layer and depositing a first dielectric layer prior to planarizing the base electrode layer, and planarizing the base electrode layer may further comprise planarizing the dielectric layer. The method may further include planarizing the counter electrode layer.

Depositing a base electrode layer may comprise depositing niobium, depositing a counter electrode layer may comprise depositing niobium, and depositing an insulating layer may comprise depositing a layer of aluminum and oxidizing the layer of aluminum to form aluminum oxide.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
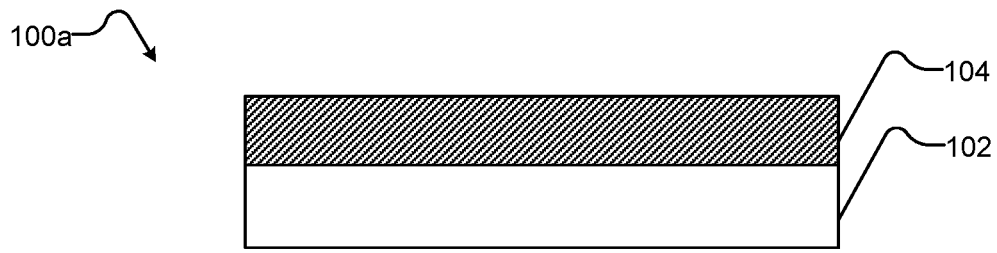
FIGS. 1A to 1H are each a respective sectional view of a portion of a superconducting integrated circuit fabricated at successive stages of fabrication, in accordance with the present methods and systems.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

A quantum processor may require a local bias to be applied on a qubit to implement a problem Hamiltonian. The local bias applied on the qubit can depend on persistent current $I_P$ and external flux bias $\phi_q$ as described below:

$$\delta h_i = 2|I_P|\delta\phi_q$$

Noise can affect the local bias $\delta h_i$ in the same way as the external flux bias $\phi_q$ and thus change the specification of the qubit terms in the problem Hamiltonian. By altering the problem Hamiltonian, noise can introduce errors into the computational result from quantum annealing.

Throughout the present specification, the phrase "noise-susceptible superconducting device" is used to describe a superconducting device for which proper performance is essential to properly annealing a quantum processor. Poor performance of a noise-susceptible device may result in the quantum processor producing inaccurate or suboptimal solutions to a problem. For example, a qubit may be considered a noise-susceptible device or device that is susceptible to noise because noise on the qubits can interfere with properly annealing the quantum processor and/or can lead to a different problem being solved. In comparison, a magnetometer in the quantum processor has a primary purpose of measuring external magnetic fields to support minimizing trapped flux. Noise on a magnetometer may not interfere with properly annealing the quantum processor, and thus, in the present specification, a magnetometer is an example of a device may be described as less susceptible or not susceptible to noise. Note that the phrase "noise-susceptible" or "susceptible to noise" does not necessarily suggest that the device itself is physically more or less sensitive to noise compared to other devices that are not described as noise-susceptible. Sensitivities to processor performance is higher in noise-susceptible devices relative to devices that are described as less susceptible to noise.

Noise in a quantum processor can cause qubits to decohere which reduces the efficacy of tunneling. As a result, processor performance can be diminished, and solutions generated from the processor can be suboptimal. Existing approaches for reducing noise involve modifying processor layouts or adding circuitry to shield qubits which, in some cases, can be impractical. The present systems and methods describe a design in which noise can be reduced in a quantum processor without necessitating significant modifications to the processor layout.

Performance of a superconducting processor can be easily affected by certain superconducting devices that are considered analog circuits, for example, qubits and couplers. Analog circuits can be very susceptible to noise. Since processor performance is particularly sensitive to proper or improper operation of these devices, it is desirable to reduce noise in these devices as much as possible. For a superconducting processor, one of the dominant sources of environmental noise is flux noise. Flux noise can cause decoherence which induces a transition from coherent to incoherent tunneling before the transition is induced by intrinsic phase transitions, which is undesirable as it limits the speed and/or accuracy with which the processor can evolve and produce solutions. Additionally, flux noise can increase spin bath susceptibility which is a "memory" effect that results in diminished sampling and optimization performance. Systems and methods to reduce spin bath polarization are described in U.S. patent application Ser. No. 16/029,026.

One approach to reducing the effect of flux noise is to use a low-noise material for layers of an integrated circuit that include superconducting devices for which reducing noise is particularly important. This can include using a low-noise material for wiring layers that form analog circuitry that contain, for example, qubits and couplers. The low-noise material can be superconducting in a respective range of temperatures. A different superconducting material can be used for layers of an integrated circuit that include superconducting devices for which noise reduction is desired but not required. Such layers can include, for example, part or all of an on-chip shield, a magnetometer, or a transformer. Thus, it can be beneficial for a superconducting integrated circuit to have noise-susceptible superconducting devices that comprise a low-noise material and other superconducting devices that comprise a different superconducting material.

The low-noise material and the different superconducting material can each transition into superconductivity at a respective critical temperature. Critical temperature is an intrinsic property of a superconducting material and is the temperature at which the electrical resistance of the superconducting material drops to zero (i.e., temperature at which it becomes superconductive). At and below the critical temperature, two electrons in a wire comprising the superconducting material will form a Cooper pair and current can persist without additional energy. For example, the critical temperature of niobium is approximately 9.2 Kelvin. At and below a temperature of 9.2 Kelvin, a niobium wire can have zero electrical resistance. Superconductivity can be indicative of a quantum mechanical state and can therefore be useful in fabricating a superconducting integrated circuit such as a quantum processor.

In some cases, it can be advantageous for an on-chip shield of a superconducting integrated circuit to comprise a superconducting material having a different critical temperature than that of a low noise material. Generally, a proximity effect can exist when a superconductor is in contact with a normal conductor, resulting in weak superconductivity in the normal conductor due to Cooper pairs being carried over to the normal conductor for a certain distance. However, a similar proximity effect can exist when a first superconducting material is in contact with a second superconducting material and the respective critical temperatures of each superconducting material are different. In such cases, a gradient of critical temperatures can exist at and near the interface of the first superconducting material and the second superconducting material. The gradient of critical temperatures caused by the proximity effect can be exploited in shielding analog circuitry that comprises one of the superconducting materials. For example, a superconducting integrated circuit can include analog circuitry formed in a wiring layer comprising aluminum and can further include a shield formed in a wiring layer comprising niobium. At an interface of the wiring layer forming analog circuitry and a wiring layer forming the shield, a gradient of critical temperatures can exist. The gradient of critical temperatures can range from a critical temperature of aluminum to a critical temperature of niobium. The gradient of critical temperatures can be beneficial in shielding analog circuitry in the wiring layer comprising aluminum because the shield in the wiring layer comprising niobium transitions into being superconductive at a higher temperature. Thus, the wiring layer comprising niobium captures some spin defects that would otherwise exist in the wiring layer comprising aluminum.

For a superconducting integrated circuit that includes wiring layers comprising more than one material, it is important that the materials integrate together so that the functionality of the superconducting integrated circuit and thus processor performance, is not compromised. For instance, forming good contacts in vias between a wiring layer comprising a superconducting material having a first critical temperature and another wiring layer comprising a low-noise material (e.g., a superconducting material having a second critical temperature) can be a challenge. Many existing fabrication processes are designed to use only one material for wiring layers in an integrated circuit. Thus, including a second material, such as a low-noise material, for wiring layers that include noise-susceptible devices or analog circuitry requires careful adjustments to process conditions. It is desirable for deposition and patterning of layers comprising a low-noise material to have no negative effects on layers comprising other materials. For example, it is desirable to deposit and pattern a layer comprising a low-noise material without corroding layers comprising other materials or forming a resistive layer.

Figure 3:
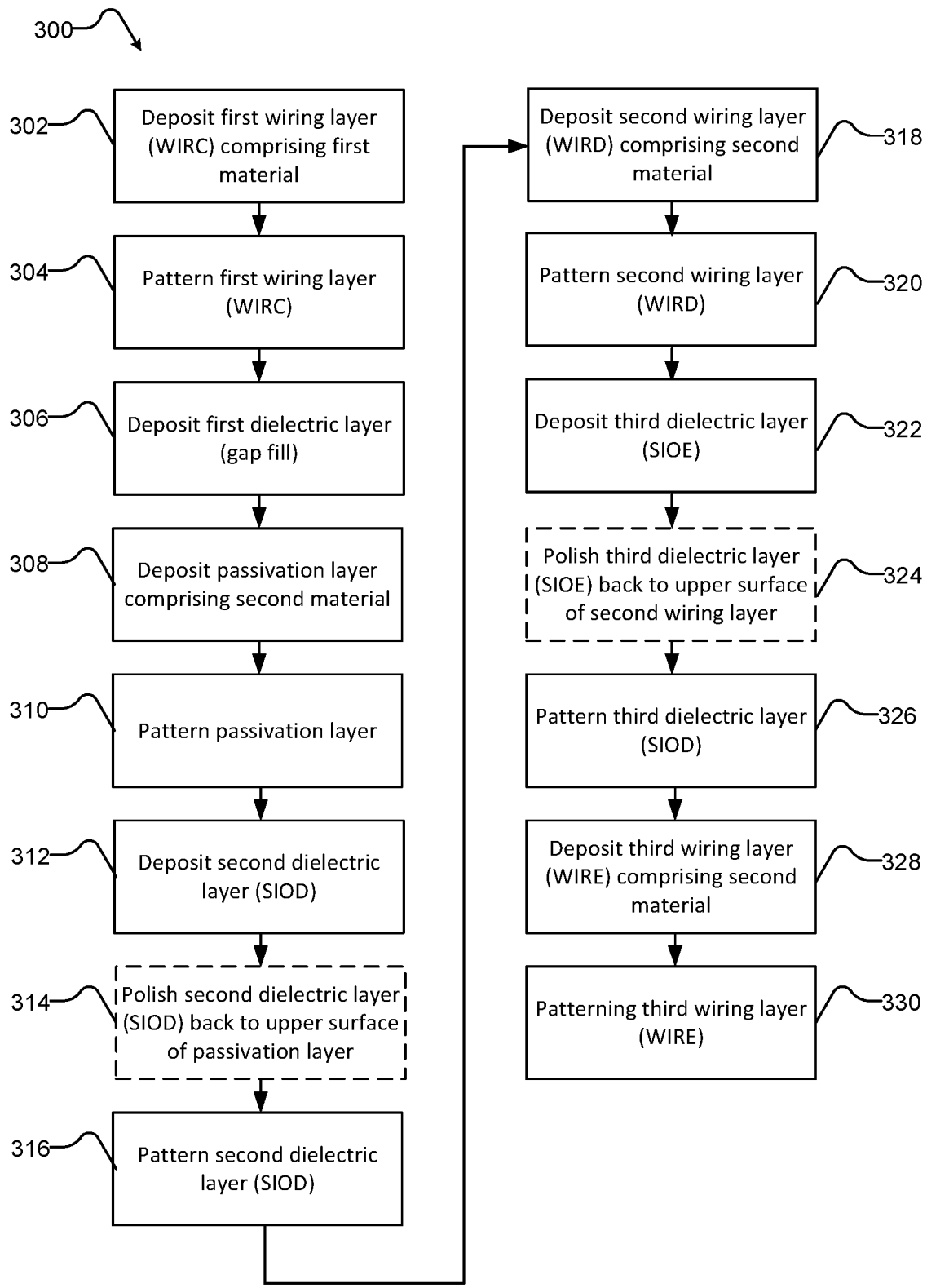
FIG. 3 is a flowchart illustrating a method for fabricating a portion of a superconducting integrated circuit comprising low-noise wiring layers, in accordance with the present systems and methods.

FIGS. 1A to 1H show a sectional view of a portion of a superconducting integrated circuit fabricated at successive stages of fabrication, according to method 300 of FIG. 3.

FIG. 1A is a sectional view of a portion of a superconducting integrated circuit 100a at a first stage of a fabrication process described by method 300 of FIG. 3. Integrated circuit 100a includes a substrate 102 and a first wiring layer 104 comprising a first material that is superconductive in a first range of temperatures. In some implementations, substrate 102 comprises at least one of: silicon and sapphire. In some implementations, first wiring layer 104 comprises niobium.

Figure 1B:

FIG. 1B is a sectional view of a portion of a superconducting integrated circuit 100b at a subsequent stage of the fabrication process. Superconducting integrated circuit 100b can be formed from integrated circuit 100a of FIG. 1A by patterning first wiring layer 104, depositing a first dielectric layer 106, and polishing first dielectric layer 106 back to the upper surface of first wiring layer 104. Patterning first wiring layer 104 can include masking and then etching first wiring layer 104. The first wiring layer can include a respective set of one or more superconducting traces. The set of one or more superconducting traces can form a superconducting device that is not susceptible to flux noise relative to a superconducting device that is included in other wiring layers. In one implementation, patterning first wiring layer 104 forms at least one of: a magnetometer, a transformer, and at least a portion of an on-chip shield. In one implementation, the first wiring layer 104 comprises niobium. In one implementation, first dielectric layer 106 comprises silicon dioxide.

Figure 1C:
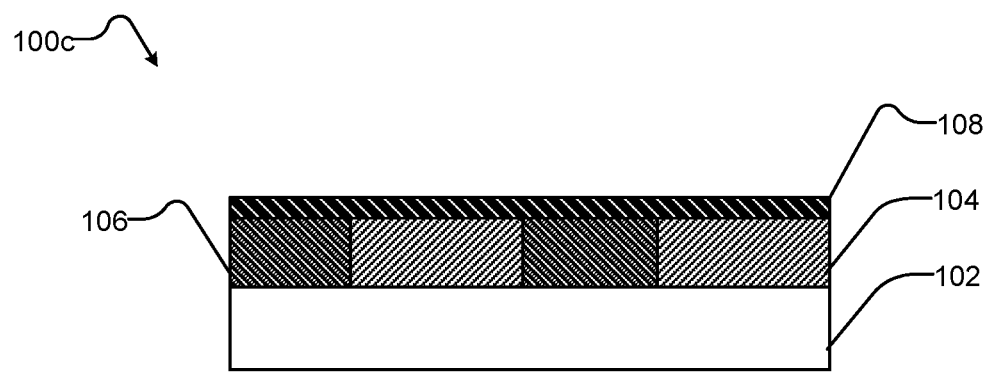

FIG. 1C is a sectional view of a portion of a superconducting integrated circuit 100c at a subsequent stage of the fabrication process. Superconducting integrated circuit 100c can be formed from integrated circuit 100b of FIG. 1B by depositing a passivation layer 108 comprising a second material that is superconductive in a second range of temperatures. Passivation layer 108 is deposited to overlie first wiring layer 104. The first range of temperatures and the second range of temperatures each include a respective critical temperature. In one implementation, the critical temperature of the first range of temperatures is higher than the critical temperature of the second range of temperatures. In one implementation, at least some of the temperatures in the first range of temperatures are the same as the temperatures in the second range of temperatures. First wiring layer 104 can be thicker than passivation layer 108. In one implementation, passivation layer 108 comprises aluminum.

Figure 1D:
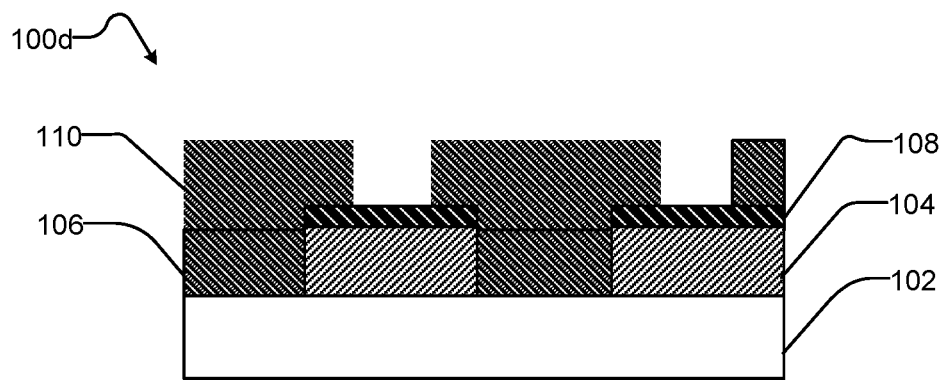

FIG. 1D is a sectional view of a portion of a superconducting integrated circuit 100d at a subsequent stage of the fabrication process. Superconducting integrated circuit 100d can be formed from integrated circuit 100c of FIG. 1C by patterning passivation layer 108, depositing a second dielectric layer 110, and then patterning second dielectric layer 110. Patterning passivation layer 108 can include masking passivation layer 108 with the same mask that was used to pattern first wiring layer 104 to form integrated circuit 100b in FIG. 1B, and then etching passivation layer 108. Passivation layer 108 can provide a surface for vias comprising the second material to adhere to. In one implementation, passivation layer 108 can protect the upper surface of first wiring layer 104. Depositing second dielectric layer 110 can include polishing second dielectric layer 110 using CMP. Patterning second dielectric layer 110 can include masking and etching second dielectric layer 110 to expose at least a portion of passivation layer 108. In one implementation, second dielectric layer can comprise silicon dioxide. Optionally, after depositing second dielectric layer 110 and before patterning second dielectric layer 110, second dielectric layer 110 can be polished back to an upper surface of passivation layer 108 and re-deposited (not illustrated in FIG. 1D). Re-depositing second dielectric layer 110 can include depositing a respective extended dielectric layer comprising the same material as second dielectric layer 110.

Figure 1E:
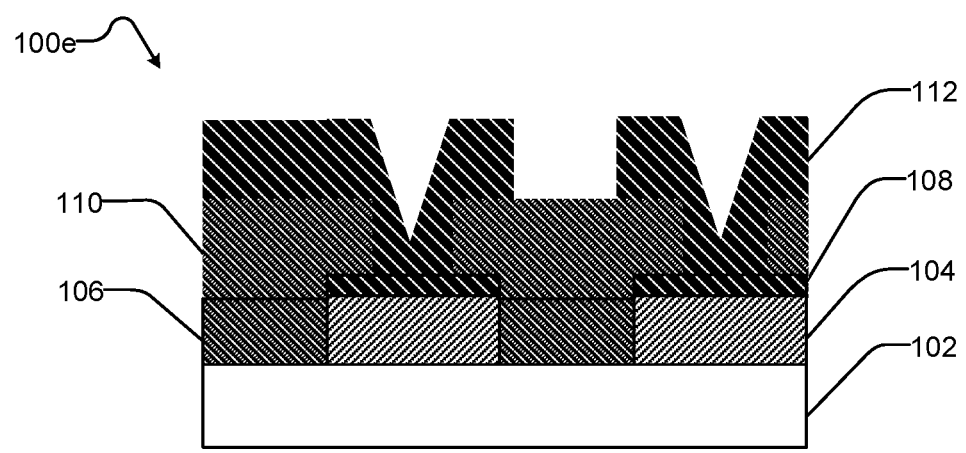

FIG. 1E is a sectional view of a portion of a superconducting integrated circuit 100e at a subsequent stage of the fabrication process. Superconducting integrated circuit 100e can be formed from integrated circuit 100d of FIG. 1D by depositing a second wiring layer 112 to form a first set of vias, and then patterning second wiring layer 112. Second wiring layer 112 comprises the second material that is superconductive in the second range of temperatures. The first set of vias electrically couples the second wiring layer 112 to passivation layer 108. Patterning second wiring layer 112 can include masking and etching second wiring layer 112. Second wiring layer 112 can include a respective set of one or more superconducting traces. The set of one or more superconducting traces can form a noise-susceptible superconducting device that is included in first wiring layer 104. In one implementation, patterning second wiring layer 112 forms at least one of: a qubit and a coupler. In one implementation, third superconducting layer 112 comprises aluminum. Second wiring layer 112 can sometimes be referred to as a "low-noise wiring layer". In one implementation, passivation layer 108 is etched via sputter etching prior to depositing second wiring layer 112. In such cases, the first set of vias can electrically couple second wiring layer 112 and first wiring layer 104.

Figure 1F:
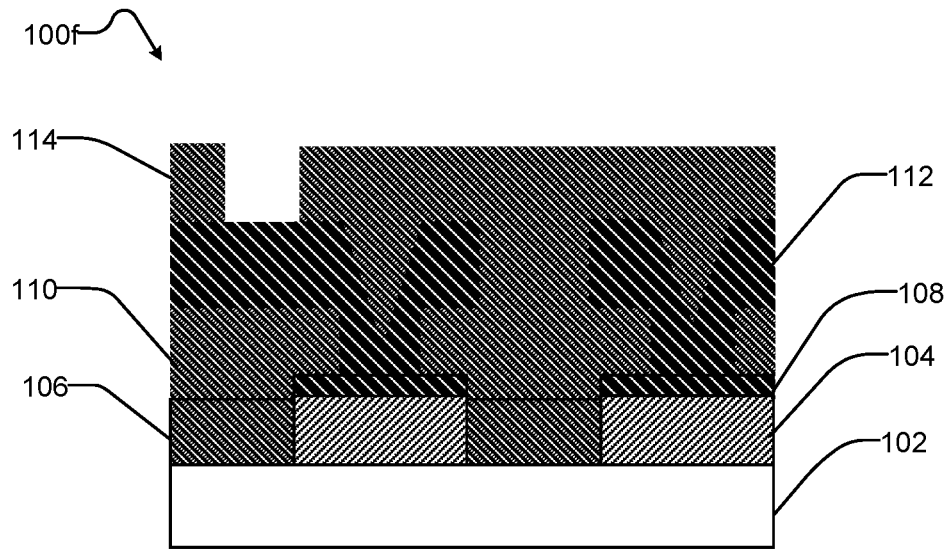

FIG. 1F is a sectional view of a portion of a superconducting integrated circuit 100f at a subsequent stage of the fabrication process. Superconducting integrated circuit 100f can be formed from integrated circuit 100e of FIG. 1E by depositing a third dielectric layer 114, polishing third dielectric layer 114, and patterning third dielectric layer 114. Optionally, after polishing third dielectric layer 114 and before patterning third dielectric layer 114, third dielectric layer 114 can be polished back to an upper surface of second wiring layer 112 and re-deposited (not illustrated in FIG. 1F). Re-depositing third dielectric layer 114 can include depositing a respective extended dielectric layer comprising the same material as third dielectric layer 114. Patterning third dielectric layer 114 can include masking and etching third dielectric layer 114 to expose at least a portion of second wiring layer 112. In one implementation, third dielectric layer comprises silicon dioxide.

Figure 1G:
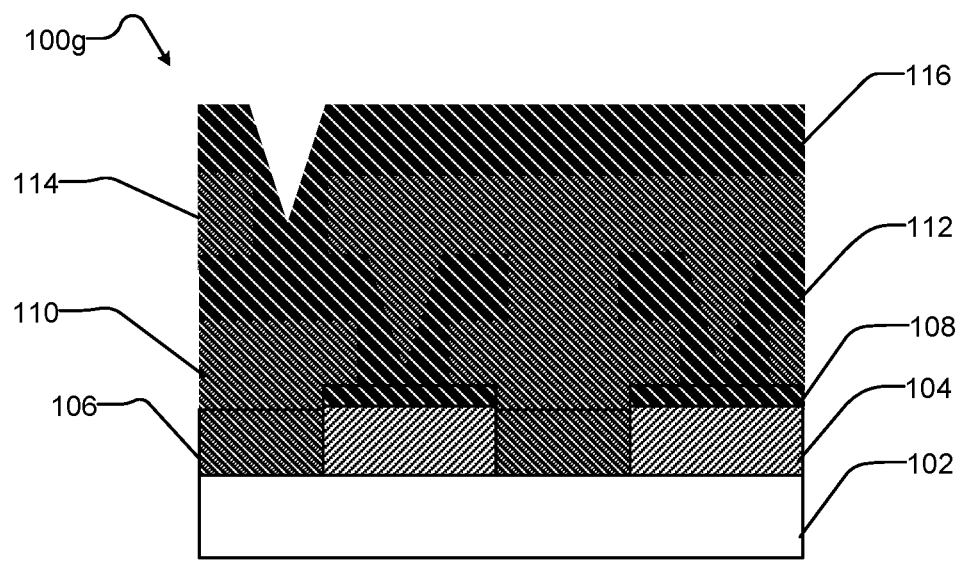

FIG. 1G is a sectional view of a portion of a superconducting integrated circuit 100g at a subsequent stage of the fabrication process. Superconducting integrated circuit 100g can be formed from integrated circuit 100f of FIG. 1F by depositing a third wiring layer 116 to form a second set of vias, and then patterning third wiring layer 116. Third wiring layer 116 comprises the second material that is superconductive in the second range of temperatures. The second set of vias electrically couples the third wiring layer 116 to second wiring layer 112. Patterning third wiring layer 116 can include masking and etching third wiring layer 116. The third wiring layer can include a respective set of one or more superconducting traces. The set of one or more superconducting traces can form a noise-susceptible superconducting device. In one implementation, patterning third wiring layer 116 forms at least one of: a qubit and a coupler. In one implementation, third wiring layer comprises aluminum. Third wiring layer 116 can sometimes be referred to as a "low-noise wiring layer".

Figure 1H:
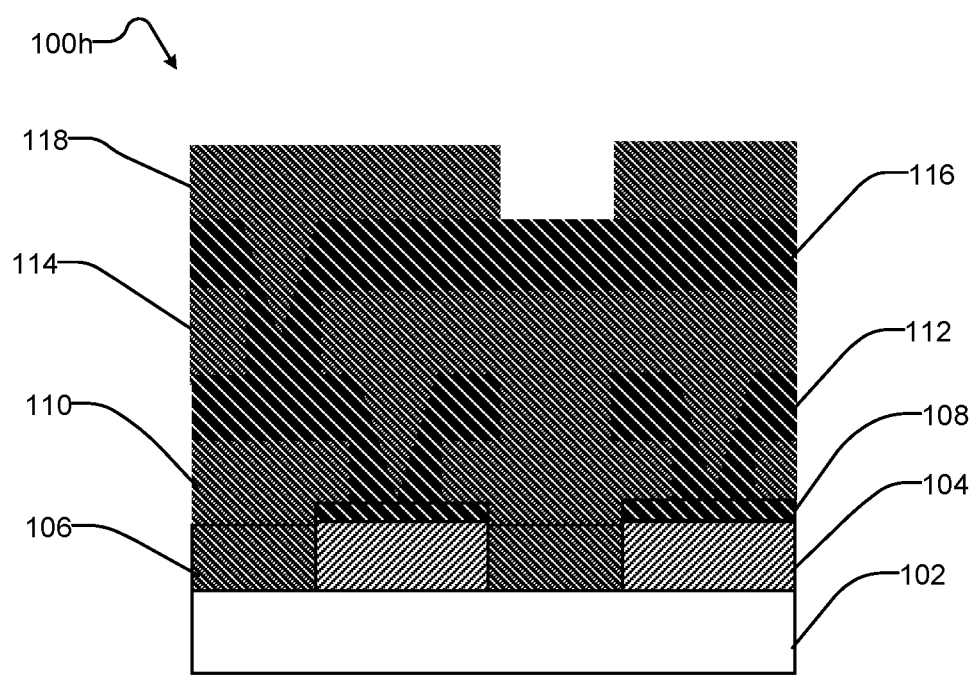

FIG. 1H is a sectional view of a portion of a superconducting integrated circuit 100h at a subsequent stage of the fabrication process. Superconducting integrated circuit 100h can be formed from integrated circuit 100g of FIG. 1G by depositing a fourth dielectric layer 118, polishing fourth dielectric layer 118, and patterning fourth dielectric layer 114. Optionally, after polishing fourth dielectric layer 118 and before patterning fourth dielectric layer 118, fourth dielectric layer 114 can be polished back to an upper surface of third wiring layer 116 and then re-deposited (not illustrated in FIG. 1H). Re-depositing fourth dielectric layer 114 can include depositing a respective extended dielectric layer comprising the same material as fourth dielectric layer 114. Patterning fourth dielectric layer 114 can include masking and etching fourth dielectric layer 118 to expose at least a portion of third wiring layer 116. An exposed portion of third wiring layer 116 can be used as a bond pad to electrically couple integrated circuit 100h to input/output electronics via a printed circuit board or another device. In one implementation, fourth dielectric layer comprises silicon dioxide. In one approach, fourth dielectric layer is a passivation layer that protects the upper surface of third wiring layer 116.

FIGS. 1A to 1H illustrate an integrated circuit wherein devices that are susceptible to noise, for example, qubits and couplers, are in the upper portion of the integrated circuit and devices that are relatively less susceptible to noise are in the lower portion of the integrated circuit. However, in some implementations, it can be advantageous to have noise-susceptible devices in the middle portion (i.e., interposed between the uppermost wiring layer and the bottommost wiring layer) or in the lower portion (i.e., closer to the substrate) of the integrated circuit. In some implementations, there can be more or less than two wiring layers that include noise-susceptible devices. In some implementation, wiring layers that include noise-susceptible devices can be at least partially in the bottommost wiring layer of the integrated circuit. In such cases, a passivation layer may overlie a set of one or more vias that electrically couple a wiring layer that includes noise-susceptible devices and a wiring layer that includes devices that are less susceptible to noise, and the passivation layer may comprise at least some of a material in the wiring layer that includes noise-susceptible devices.

Figure 2:
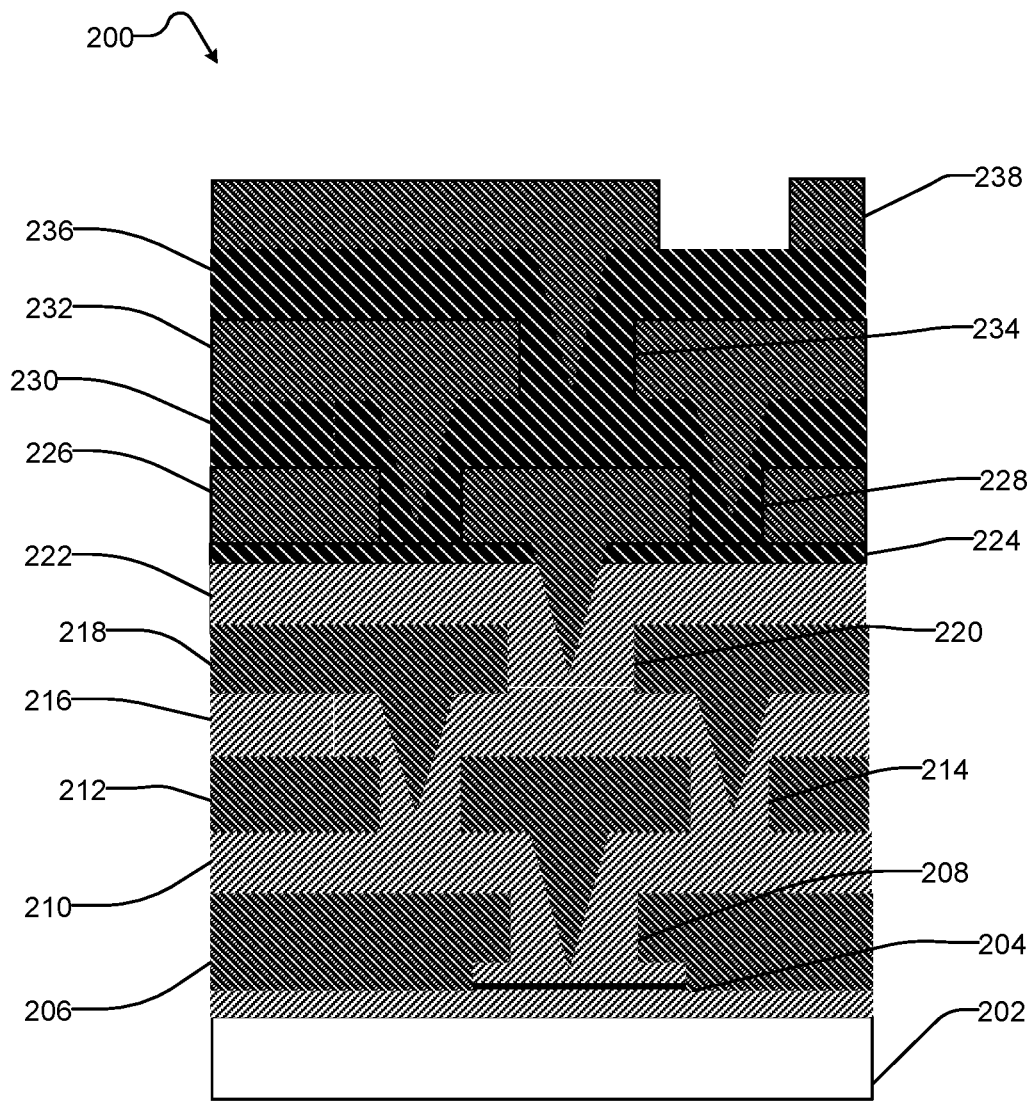
FIG. 2 is a sectional view of a portion of a superconducting integrated circuit comprising a trilayer Josephson junction and low-noise wiring layers, in accordance with the present systems and methods.

FIG. 2 shows a sectional view of a portion of a superconducting integrated circuit fabricated 200 according to method 300 of FIG. 3. Integrated circuit 200 is an implementation of integrated circuit 100h of FIG. 1H that further comprises a set of additional wiring layers and a trilayer Josephson junction.

Integrated circuit 200 includes a substrate 202 carrying a trilayer Josephson junction 204. Trilayer Josephson junction 204 can include two electrodes comprising aluminum that sandwich a thin oxide layer. A first dielectric layer 206 overlies at least a portion of trilayer Josephson junction 204. First dielectric layer 206 is patterned to expose at least a portion of trilayer Josephson junction 220.

A first superconducting metal layer is deposited to overlie at least a portion of trilayer Josephson junction 220 and forms a first set of vias 208. The first superconducting metal layer also overlies at least a portion of first dielectric layer 206. The first superconducting metal layer can be patterned to form a first wiring layer 210 that includes a respective set of one or more superconducting traces. First set of vias 208 electrically couple trilayer Josephson junction 204 to first wiring layer 210.

A second dielectric layer 212 overlies at least a portion of first wiring layer 210. Second dielectric layer 212 is patterned to expose at least a portion of first wiring layer 210. In one implementation, second dielectric layer 212 can comprise silicon dioxide.

A second superconducting metal layer is deposited to overlie at least a portion of first wiring layer 210 and forms a second set of vias 214. The second superconducting metal layer also overlies at least a portion of second dielectric layer 212. The second superconducting metal layer can be patterned to form a second wiring layer 216 that includes a respective set of one or more superconducting traces. Second set of vias 214 electrically couple first wiring layer 210 to second wiring layer 216.

A third dielectric layer 218 overlies at least a portion of second wiring layer 216. Third dielectric layer 216 is patterned to expose at least a portion of second wiring layer 216.

A third superconducting metal layer is deposited to overlie at least a portion of second wiring layer 216 and forms a third set of vias 220. The third superconducting metal layer also overlies at least a portion of third dielectric layer 218. The third superconducting metal layer can be patterned to form a third wiring layer 222 that includes a respective set of one or more superconducting traces. Third set of vias 220 electrically couple third wiring layer 222 to second wiring layer 216.

First wiring layer 210, second wiring layer 216, and third wiring layer 222 each include a respective set of one or more superconducting traces. Each set of one or more superconducting traces can form a superconducting device that is not susceptible to noise relative to a superconducting device in another layer of integrated circuit 200. For example, first wiring layer 210, second wiring layer 216, and third wiring layer 222 can each include at least one of: a shield, a magnetometer, and a transformer. First wiring layer 210, second wiring layer 216, and third wiring layer 222 each comprise a first material that is superconductive in a first range of temperatures. In one implementation, first wiring layer 210, second wiring layer 216, and third wiring layer 222 each comprise niobium. In one implementation, first dielectric layer 206, second dielectric layer 212, and third dielectric layer 218 each comprise silicon dioxide.

A fourth superconducting metal layer is deposited to overlie at least a portion of third wiring layer 222. The fourth superconducting metal layer can be patterned using a mask that has the same geometric pattern as another mask that was used to pattern the third superconducting metal layer to form third wiring layer 222. The fourth superconducting metal layer can be patterned to form a passivation layer 224. Passivation layer 224 can comprise a second material that is superconductive in a second range of temperatures. Passivation layer 224 overlies at least a portion of third wiring layer 222 and is electrically coupled to third wiring layer 222. Passivation layer 224 can provide a surface that is more suitable for a set of vias comprising the second material to adhere to relative to wiring layer 222. In one implementation, third wiring layer 222 is thicker than passivation layer 224. In one implementation, passivation layer 224 comprises aluminum.

A fourth dielectric layer 226 overlies at least a portion of passivation layer 224. Fourth dielectric layer 226 is patterned to expose at least a portion of passivation layer 224.

A fifth superconducting metal layer is deposited to overlie at least a portion of passivation layer 224 and forms a fourth set of vias 228. The fifth superconducting metal layer also overlies at least a portion of fourth dielectric layer 226. The fifth superconducting metal layer can be patterned to form a fourth wiring layer 230 that includes a respective set of one or more superconducting traces. Fourth set of vias 228 electrically couple fourth wiring layer 230 to passivation layer 224.

A fifth dielectric layer 232 overlies at least a portion of fourth wiring layer 230. Fifth dielectric layer 226 is patterned to expose at least a portion of fourth wiring layer 230.

A sixth superconducting metal layer is deposited to overlie at least a portion of fourth wiring layer 230 and forms a fifth set of vias 234. The sixth superconducting metal layer also overlies at least a portion of fifth dielectric layer 226. The sixth superconducting metal layer can be patterned to form a fifth wiring layer 236 that includes a respective set of one or more superconducting traces. Fifth set of vias 234 electrically couple fourth wiring layer 230 to fifth wiring layer 236.

Fourth wiring layer 230 and fifth wiring layer 236 each include a respective set of one or more superconducting traces. Each set of one or more superconducting traces can form a superconducting device that is noise-susceptible relative to a superconducting device included in at least one of: first wiring layer 210, second wiring layer 216, and third wiring layer 222. For example, fourth wiring layer 230 and fifth wiring layer 236 can each include at least one of: a qubit and a coupler. Fourth wiring layer 230 and fifth wiring layer 236 can sometimes be referred to as "low-noise wiring layers". Passivation layer 224, fourth wiring layer 230, and fifth wiring layer 236 each comprise the second material that is superconductive in the second range of temperatures. In one implementation, passivation layer 224, fourth wiring layer 230, and fifth wiring layer 236 each comprise aluminum. In one implementation, fourth dielectric layer 226 and fifth dielectric layer 232 comprise silicon dioxide. In one implementation, fourth dielectric layer 226 and fifth dielectric layer 232 comprise an electrically insulative material that is different from first dielectric layer 206, second dielectric layer 212, and third dielectric layer 218.

Elements of integrated circuit 200 comprise the first material that is superconductive in the first range of temperatures and the second material that is superconductive in the second range of temperatures. The first range of temperatures and the second range of temperatures can each include a respective critical temperature. In one implementation, the critical temperature of the first range of temperatures can be higher than the critical temperature of the second range of temperatures. For example, the first material can transition into being superconductive at 9 Kelvin and the second material can transition into being superconductive at 1.2 Kelvin. In one implementation, at least some of the temperatures in the first range of temperatures are the same as the temperatures in the second range of temperatures.

FIG. 3 is a flowchart illustrating a method 300 for fabricating a portion of a superconducting integrated circuit with low-noise, in accordance with the present systems and methods. Method 300 includes acts 302-330, though in other implementations, certain acts can be omitted and/or additional acts can be added. Method 300 can be performed by, for example, integrated circuit fabrication equipment in response to an initiation of a fabrication process.

At 302, a first wiring layer comprising a first material is deposited to overlie a substrate. The first material is superconductive in a first range of temperatures. In one implementation, the first wiring layer comprising the first material can be deposited to overlie a least a portion of an additional wiring layer. In some implementations, the first wiring layer comprises aluminum.

At 304, the first wiring layer is patterned. Patterning the first wiring layer can form a respective set of one or more superconducting traces. The first wiring layer can include a superconducting device that is less susceptible to noise relative to another superconducting device in another wiring layer. In one implementation, patterning the first wiring layer can form at least a portion of an on-chip shield. In one implementation, patterning the first wiring layer can form at least a portion of a magnetometer or a transformer. Patterning the first wiring layer can include masking and etching the first wiring layer.

At 306, a first dielectric layer is deposited to overlie at least a portion of the first wiring layer. The first dielectric layer can fill an opening in between one or more superconducting traces of the first wiring layer. The first dielectric layer is polished back to an upper surface of the first wiring layer. At least a portion of the first wiring layer can be exposed.

At 308, a passivation layer comprising a second material is deposited to overlie at least a portion of the first wiring layer. The second material is superconductive in a second range of temperatures. The passivation layer can form a surface that is suitable for vias comprising the second material to adhere to. The first range of temperatures and the second range of temperatures each include a respective critical temperature. In one implementation, the critical temperature of the first range of temperatures is higher than the critical temperature of the second range of temperatures. In one implementation, at least some of the temperatures in the first range of temperatures are the same as the temperatures in the second range of temperatures.

At 310, the passivation layer is patterned. Patterning the passivation layer can include masking and etching the passivation layer. The passivation layer can be patterned using a mask that has a geometric pattern that is the same as another mask used to pattern the first wiring layer in act 304.

At 312, a second dielectric layer is deposited to overlie at least a portion of the passivation layer. The second dielectric layer can overlie at least a portion of the first wiring layer. The second dielectric layer can fill an opening in between one or more superconducting traces of the second wiring layer.

Optionally, at 314, the second dielectric layer is polished back to an upper surface of the passivation layer, redeposited, and then polished back to a respective thickness.

At 316, the second dielectric layer is patterned. Patterning the second dielectric layer can expose at least a portion of the passivation layer. Patterning the second dielectric layer can include masking and etching the second dielectric layer.

At 318, a second wiring layer comprising the second material is deposited to overlie at least a portion of the passivation layer. The second wiring layer can overlie at least a portion of the second dielectric layer. The second material is superconductive in the second range of temperatures. Depositing the second wiring layer can form a first set of vias that electrically couple the passivation layer to the second wiring layer.

At 320, the second wiring layer is patterned. Patterning the second wiring layer can form a respective set of one or more superconducting traces. The second wiring layer can include a superconducting device that is noise-susceptible. In one implementation, patterning the second wiring layer can form at least one of: a qubit and a coupler. Patterning the second wiring layer can include masking and etching the second wiring layer.

At 322, a third dielectric layer is deposited to overlie at least a portion of the second wiring layer. The third dielectric layer can fill an opening in between one or more superconducting traces of the second wiring layer.

Optionally, at 324, the third dielectric layer is polished back to an upper surface of the second wiring layer, redeposited, and then polished back to a respective thickness.

At 326, the third dielectric layer is patterned. Patterning the third dielectric layer can expose at least a portion of the second wiring layer. Patterning the third dielectric layer can include masking and etching the third dielectric layer.

At 328, a third wiring layer comprising the second material is deposited to overlie at least a portion of the second wiring layer. The third wiring layer can overlie at least a portion of the third dielectric layer. The second material is superconductive in the second range of temperatures. Depositing the third wiring layer can form a second set of vias that electrically couple the second wiring layer to the third wiring layer.

At 330, the third wiring layer is patterned. Patterning the third wiring layer can form a respective set of one or more superconducting traces. The third wiring layer can include a superconducting device that is noise-susceptible. In one implementation, patterning the third wiring layer can form at least one of: a qubit and a coupler. Patterning the third wiring layer can include masking and etching the third wiring layer.

Figure 4:
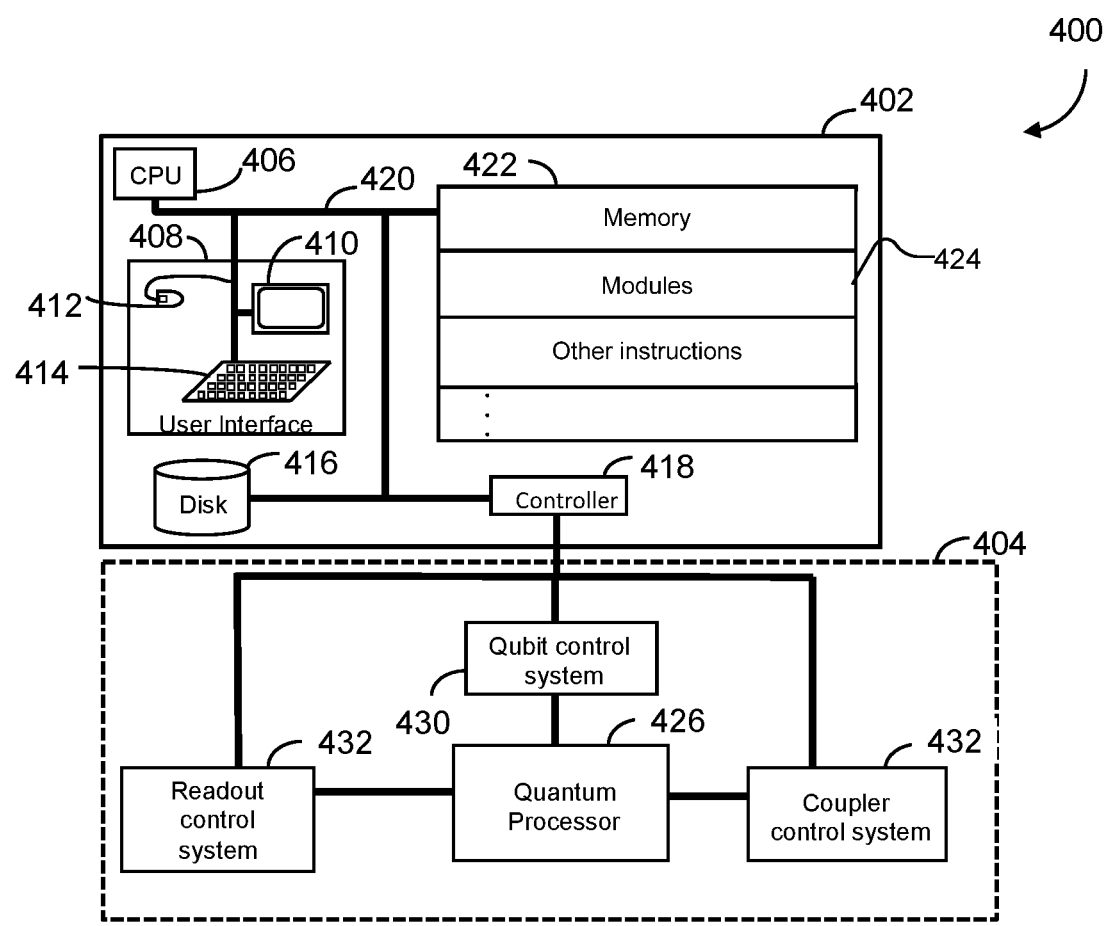
FIG. 4 is a schematic diagram illustrating a computing system comprising a digital computer and an analog computer that includes a superconducting integrated circuit, in accordance with the present systems and methods.

FIG. 4 illustrates a computing system 400 comprising a digital computer 402. The example digital computer 402 includes one or more digital processors 406 that may be used to perform classical digital processing tasks. Digital computer 402 may further include at least one system memory 422, and at least one system bus 420 that couples various system components, including system memory 422 to digital processor(s) 406. System memory 422 may store a set of modules 424.

The digital processor(s) 406 may be any logic processing unit or circuitry (e.g., integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 400 comprises an analog computer 404, which may include one or more quantum processors 426.

Quantum processor 426 can be at least one superconducting integrated circuit that includes noise-susceptible superconducting devices comprising a first material and regular superconducting devices comprising a second material. The first material and the second material can each be superconductive in a respective range of temperatures. Quantum processor 426 can include at least one integrated circuit that is fabricated using methods as described in greater detail herein. Digital computer 402 may communicate with analog computer 404 via, for instance, a controller 418. Certain computations may be performed by analog computer 404 at the instruction of digital computer 402, as described in greater detail herein.

Digital computer 402 may include a user input/output subsystem 408. In some implementations, the user input/output subsystem includes one or more user input/output components such as a display 410, mouse 412, and/or keyboard 414.

System bus 420 can employ any known bus structures or architectures, including a memory bus with a memory controller, a peripheral bus, and a local bus. System memory 422 may include non-volatile memory, such as read-only memory ("ROM"), static random access memory ("SRAM"), Flash NAND; and volatile memory such as random access memory ("RAM") (not shown).

Digital computer 402 may also include other non-transitory computer- or processor-readable storage media or non-volatile memory 416. Non-volatile memory 416 may take a variety of forms, including: a hard disk drive for reading from and writing to a hard disk (e.g., magnetic disk), an optical disk drive for reading from and writing to removable optical disks, and/or a solid state drive (SSD) for reading from and writing to solid state media (e.g., NAND-based Flash memory). Non-volatile memory 416 may communicate with digital processor(s) via system bus 420 and may include appropriate interfaces or controllers 418 coupled to system bus 420. Non-volatile memory 416 may serve as long-term storage for processor- or computer-readable instructions, data structures, or other data (sometimes called program modules) for digital computer 402.

Although digital computer 402 has been described as employing hard disks, optical disks and/or solid state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory can be cached to non-volatile memory. Or a solid-state disk that employs integrated circuits to provide non-volatile memory.

Various processor- or computer-readable instructions, data structures, or other data can be stored in system memory 422. For example, system memory 422 may store instruction for communicating with remote clients and scheduling use of resources including resources on the digital computer 402 and analog computer 404. Also for example, system memory 422 may store at least one of processor executable instructions or data that, when executed by at least one processor, causes the at least one processor to execute the various algorithms to execute instructions. In some implementations system memory 422 may store processor- or computer-readable calculation instructions and/or data to perform pre-processing, co-processing, and post-processing to analog computer 404. System memory 422 may store a set of analog computer interface instructions to interact with analog computer 404.

Analog computer 404 may include at least one analog processor such as quantum processor 426. Analog computer 404 can be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1° Kelvin.

Analog computer 404 can include programmable elements such as qubits, couplers, and other devices. Qubits can be read out via readout system 428. Readout results can be sent to other computer- or processor-readable instructions of digital computer 402. Qubits can be controlled via a qubit control system 430. Qubit control system 430 can include on-chip DACs and analog lines that are operable to apply a bias to a target device. Couplers that couple qubits can be controlled via a coupler control system 432. Couple control system 432 can include tuning elements such as on-chip DACs and analog lines. Qubit control system 430 and coupler control system 432 can be used to implement a quantum annealing schedule as described herein on analog processor 404. Programmable elements can be included in quantum processor 426 in the form of an integrated circuit. Qubits and couplers can be positioned in layers of the integrated circuit that comprise a first material. Other devices, such as readout control system 432, can be positioned in other layers of the integrated circuit that comprise a second material.

In some implementations, such as when forming a Josephson junction, three layers are required, that is, a base electrode, an insulating layer, and a counter electrode. The three layers are also referred to in the present application as a trilayer. The trilayer is also referred to in the present application as a Josephson junction trilayer. In these implementations, the base electrode layer is formed of a first superconducting material. The base electrode layer may, for example, be formed through a film deposition process, and the application may require that the base electrode layer have a certain thickness. For example, there may be certain thickness requirements in order to conduct a certain amount of superconducting current. In order to form high-integrity Josephson junctions, it may be desirable for the top surface of this base layer to be smooth prior to receiving the insulating layer. In some implementations, the insulating layer may be formed of a second superconducting material that is oxidized to form an insulating layer or may be formed from direct deposition of a layer of insulating material. The insulating layer is also referred to in the present application as a barrier layer. The barrier layer is also referred to in the present application as a tunnel barrier layer.

Figure 7:
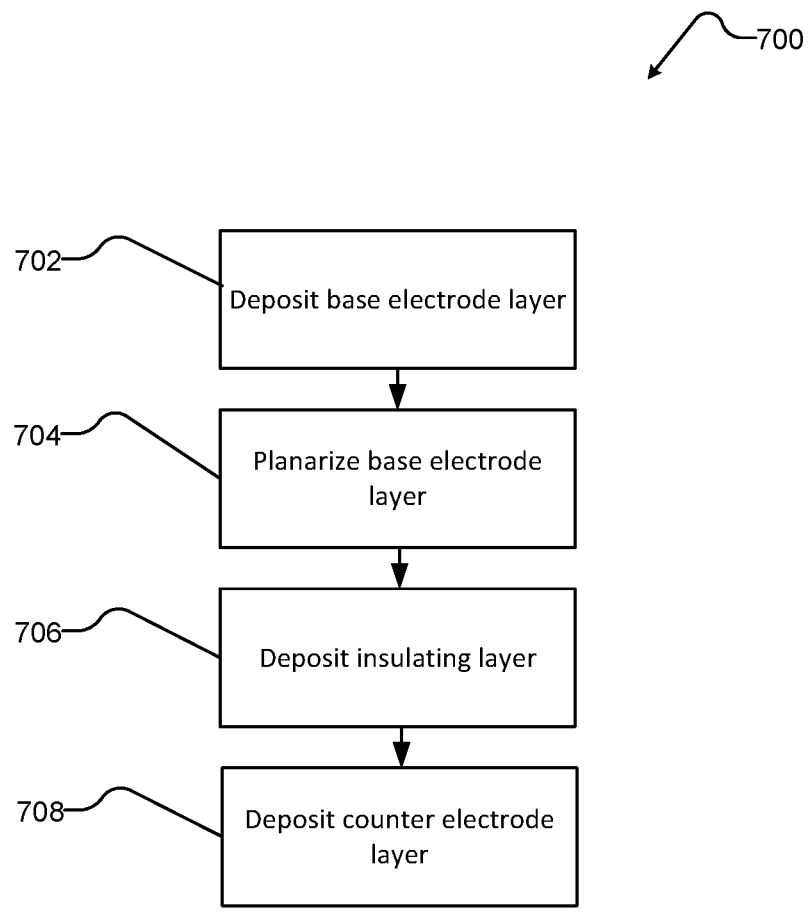
FIG. 7 is a flow chart illustrating a method for fabricating a portion of a superconducting integrated circuit comprising a planarized base electrode, in accordance with the present systems and methods.

FIGS. 5A to 5D show sectional views of a portion of a superconducting integrated circuit fabricated at successive stages of fabrication, according to method 700 of FIG. 7.

Figure 5A:
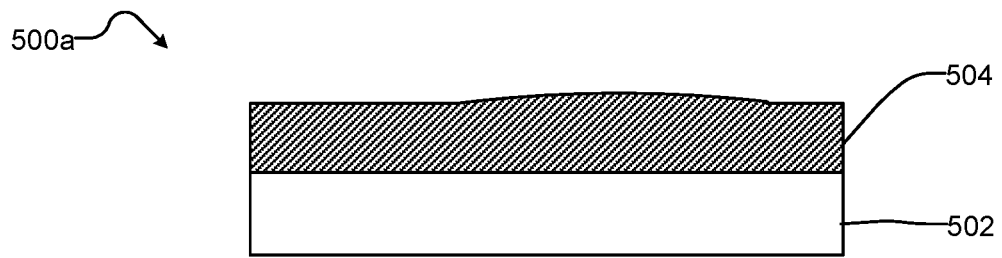
FIGS. 5A to 5D are each a respective sectional view of a portion of a superconducting integrated circuit fabricated at successive stages of fabrication, in accordance with the present methods and systems.

FIG. 5A shows a sectional view of a portion of a superconducting integrated circuit 500a at a first stage of a fabrication process described by method 700 of FIG. 7. In the depicted implementation, integrated circuit 500a includes a substrate 502. In some implementations, substrate 502 may be at least one of silicon and sapphire. A base electrode layer 504 is deposited on substrate 502. Base electrode layer 504 has a deposited top surface having a first roughness. It will be understood that the first roughness may be raised due to topological features formed during deposition of base electrode layer 504. Base electrode layer 504 may be a first material that is superconductive in a first range of temperatures. In some implementations, base electrode layer 504 may be formed from niobium.

Figure 5B:
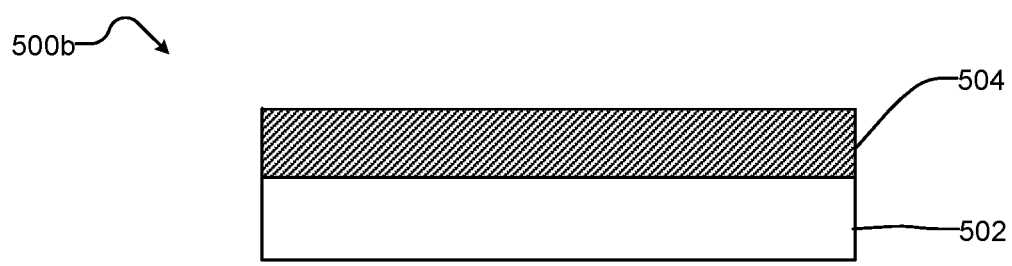

FIG. 5B shows a sectional view of a portion of a superconducting integrated circuit 500b at a subsequent stage of the fabrication process. Superconducting integrated circuit 500b can be formed from integrated circuit 500a of FIG. 5A by planarizing base electrode layer 504 to provide a planarized top surface having a second surface roughness that is less than the first surface roughness of base electrode layer 504. Planarizing dielectric layer 506 and base electrode layer 504 may involve the use of a chemical-mechanical planarization process (also referred to in the present application as CMP) to reduce the roughness or surface topography created in the depositing of base electrode layer 504. CMP is also referred to in the present application as a chemical-mechanical polishing process. In some implementations, the planarized top surface of base electrode layer 504 may be atomically smooth.

Figure 5C:
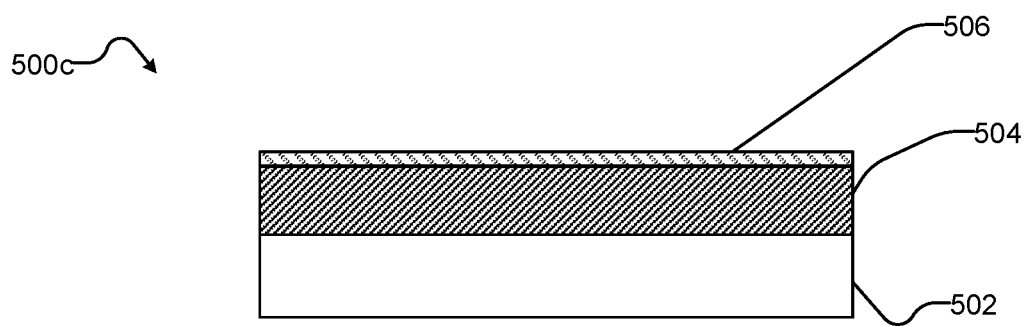

FIG. 5C shows a sectional view of a portion of a superconducting integrated circuit 500c at a subsequent stage of the fabrication process. Superconducting integrated circuit 500c can be formed from integrated circuit 500b of FIG. 5B by depositing an insulating layer 506 to overly at least a portion of base electrode layer 504. In some implementations, insulating layer 506 may be formed by depositing a layer of aluminum, and allowing surface oxidation to form a layer of aluminum oxide on the top surface of the layer of aluminum. In other implementations, the insulating layer may be formed by direct deposition of aluminum oxide. In yet other implementations, the insulating layer may be formed by direct deposition of another insulating material.

Figure 5D:
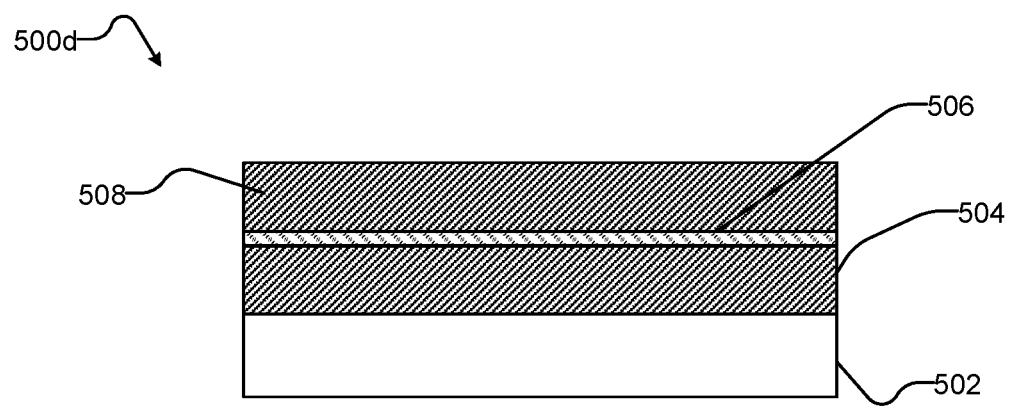

FIG. 5D shows a sectional view of a portion of a superconducting integrated circuit 500d at a subsequent stage of the fabrication process. Superconducting integrated circuit 500d can be formed from integrated circuit 500c of FIG. 5C by depositing a counter electrode layer 508 to overly at least a portion of insulating layer 506. Counter electrode layer 508 may be a first material that is superconductive in a first range of temperatures. In some implementations, counter electrode layer 508 may be formed from niobium. In some implementations, it may be desired to planarize the top surface of counter electrode layer 508 after deposition, in a similar manner to that described above with respect to FIG. 5B.

It will be understood that while the stages of fabrication shown in FIG. 5A to 5D are shown as being completed on substrate 502, similar processing operations may be employed at different locations on a superconducting integrated circuit, and multiple similar structures may be formed at varying heights within the circuit. It will further be understood that in some implementations, further processing operations may be included in the fabrication process, as will be discussed further below. For example, in some implementations, it may be desired to pattern the trilayer of FIG. 5D, such as through masking and etching counter electrode layer 508, insulating layer 506, and base electrode layer 504.

Figure 8:
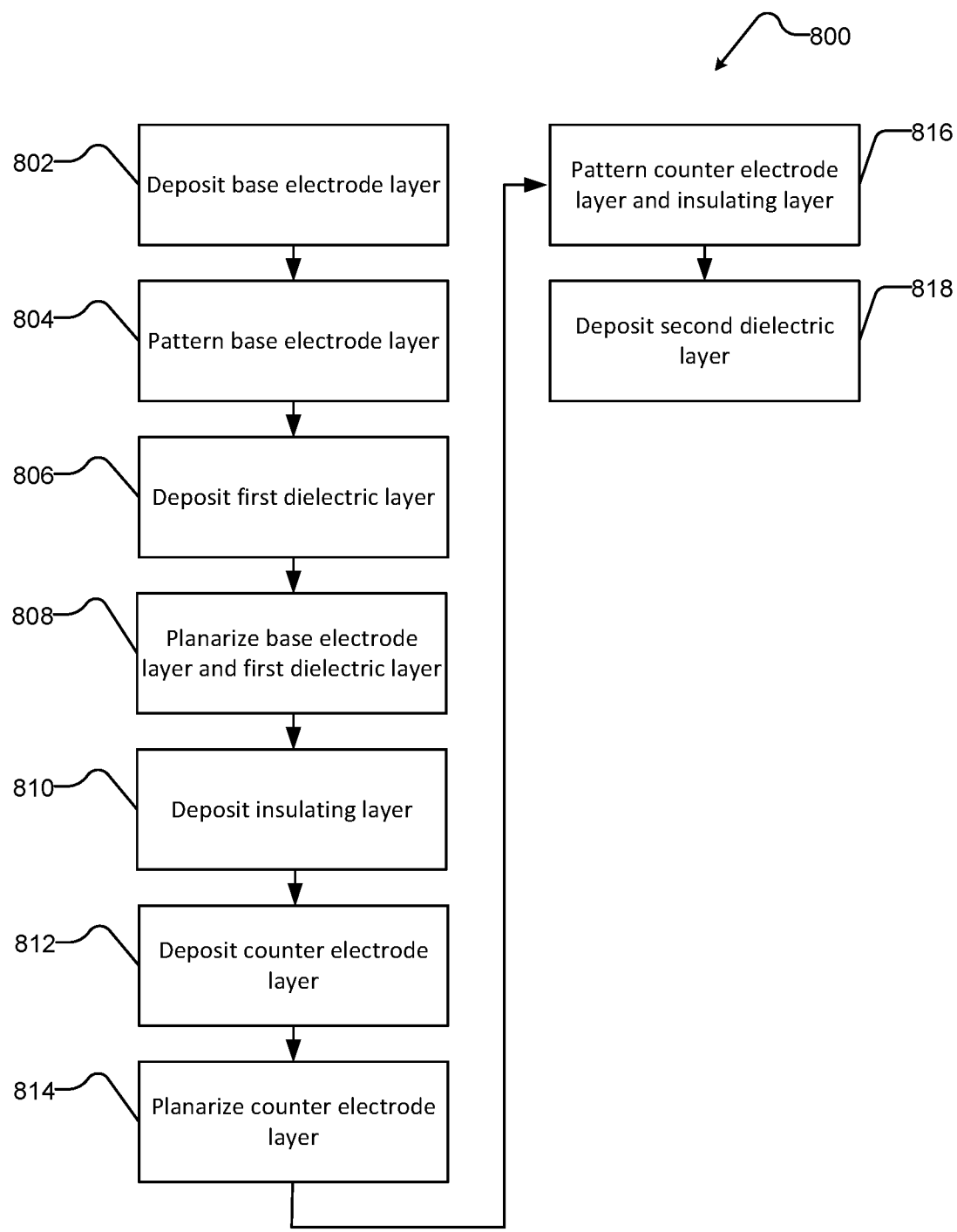
FIG. 8 is a flow chart illustrating another implementation of a method for fabricating a portion of a superconducting integrated circuit comprising a planarized base electrode, in accordance with the present system and methods.

FIGS. 6A to 6I show sectional views of a portion of a superconducting integrated circuit fabricated at successive stages of fabrication, according to method 800 of FIG. 8.

Figure 6A:
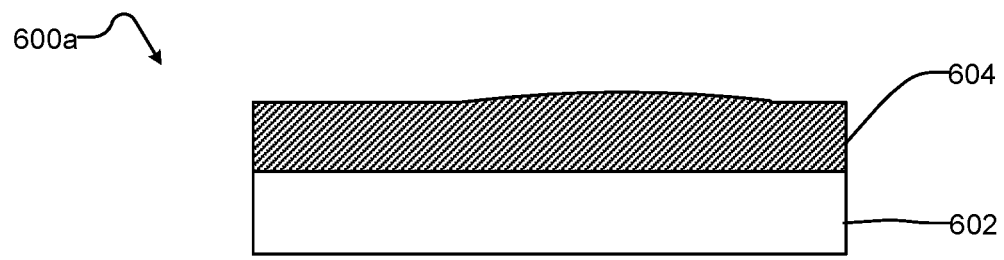
FIGS. 6A to 6I are each a respective sectional view of a portion of a superconducting integrated circuit fabricated at successive stages of fabrication, in accordance with the present methods and systems.

FIG. 6A shows a sectional view of a portion of a superconducting integrated circuit 600a at a first stage of a fabrication process described by method 800 of FIG. 8. In the depicted implementation, integrated circuit 600a includes a substrate 602. In some implementations, substrate 602 may be at least one of silicon and sapphire. A base electrode layer 604 is deposited on substrate 602. Base electrode layer 604 has a deposited top surface having a first roughness. It will be understood that the first roughness may be raised due to topological features formed during deposition of base electrode layer 604. Base electrode layer 604 may be a first material that is superconductive in a first range of temperatures. In some implementations, base electrode layer 504 may be formed from niobium.

Figure 6B:
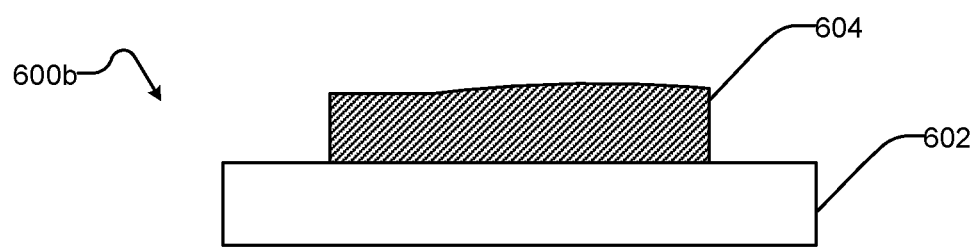

FIG. 6B shows a sectional view of a portion of a superconducting integrated circuit 600*b* at a subsequent stage of the fabrication process. Superconducting integrated circuit 600*b* can be formed from integrated circuit 600*a* of FIG. 6A by patterning base electrode layer 604. Patterning base electrode layer 604 may include masking and etching base electrode layer 604.

Figure 6C:
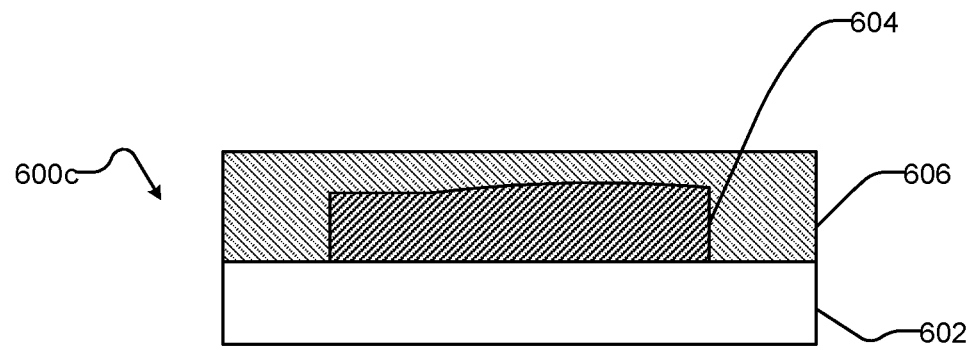

FIG. 6C shows a sectional view of a portion of a superconducting integrated circuit 600*c* at a subsequent stage of the fabrication process. Superconducting integrated circuit 600*c* can be formed from integrated circuit 600*b* of FIG. 6B by depositing a dielectric layer 606. In some implementations, dielectric layer 606 may comprise silicon dioxide.

Figure 6D:
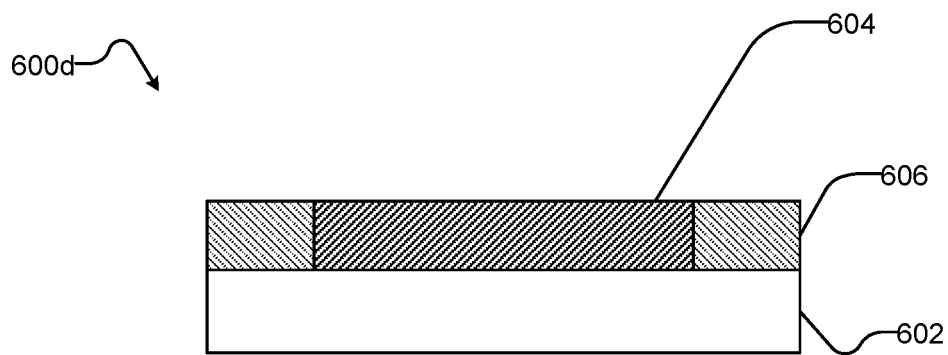

FIG. 6D shows a sectional view of a portion of a superconducting integrated circuit 600*d* at a subsequent stage of the fabrication process. Superconducting integrated circuit 600*d* can be formed from integrated circuit 600*c* of FIG. 6C by planarizing dielectric layer 606 and base electrode layer 604 to provide a planarized top surface having a second surface roughness that is less than the first surface roughness of base electrode layer 604. Planarizing dielectric layer 606 and base electrode layer 604 may involve the use of a chemical-mechanical planarization process (also referred to in the present application as CMP) to reduce the level of dielectric layer 606 to be planar with base electrode layer 604 and reduce the roughness or surface topography created in the depositing of base electrode layer 604. CMP is also referred to in the present application as a chemical-mechanical polishing process. In some implementations, the planarized top surface of base electrode layer 604 may be atomically smooth.

Figure 6E:
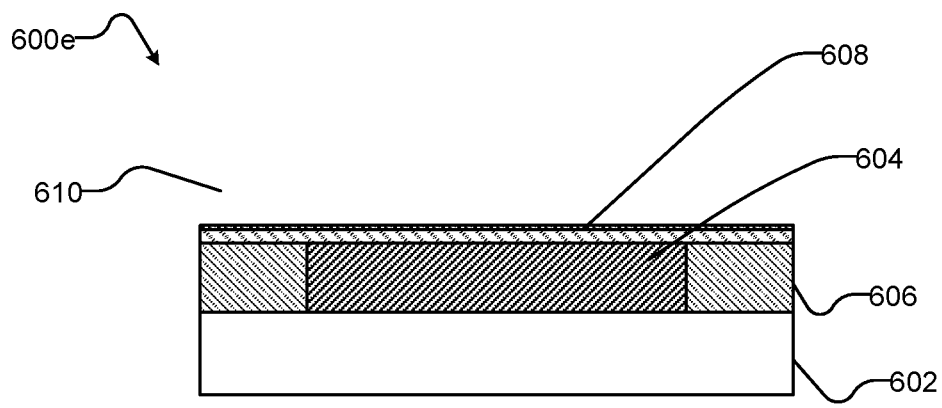

FIG. 6E shows a sectional view of a portion of a superconducting integrated circuit 600*e* at a subsequent stage of the fabrication process. Superconducting integrated circuit 600*e* can be formed from integrated circuit 600*d* of FIG. 6D by depositing an insulating layer 608 to overly at least a portion of the smooth upper surface. In some implementations, insulating layer 608 may be formed by depositing a layer of aluminum, and allowing surface oxidation to form a layer of aluminum oxide on the top surface of the layer of aluminum. In other implementations, the insulating layer may be formed by direct deposition of aluminum oxide. In yet other implementations, the insulating layer may be formed by direct deposition of another insulating material.

Figure 6F:
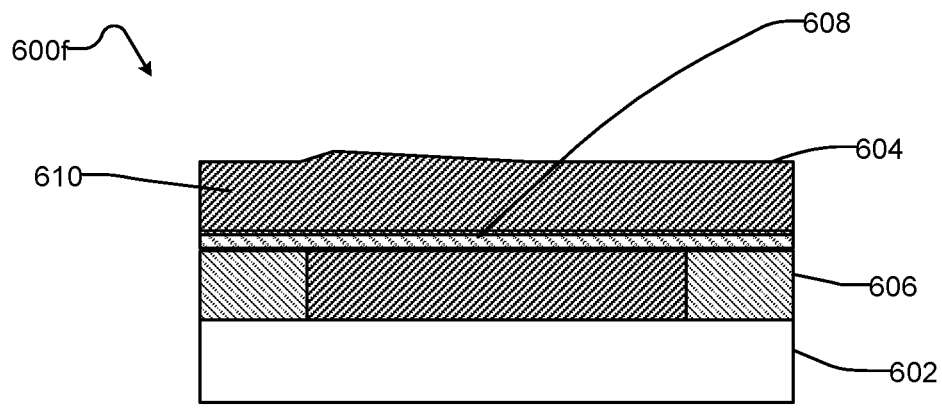

FIG. 6F shows a sectional view of a portion of a superconducting integrated circuit 600*f* at a subsequent stage of the fabrication process. Superconducting integrated circuit 600*f* can be formed from integrated circuit 600*e* of FIG. 6E by depositing a counter electrode layer 610 to overly at least a portion of insulating layer 608. Counter electrode layer 610 may be a first material that is superconductive in a first range of temperatures. In some implementations, counter electrode layer 610 may be formed from niobium.

Figure 6G:
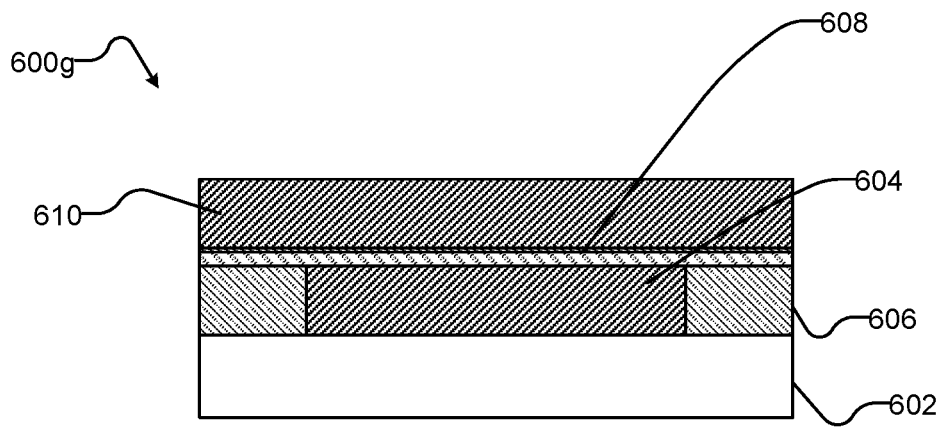

FIG. 6G shows a sectional view of a portion of a superconducting integrated circuit 600*g* at a subsequent stage of the fabrication process. Superconducting integrated circuit 600*g* can be formed from integrated circuit 600*f* by planarizing counter electrode layer 610 after deposition, in a similar manner to that described above with respect to FIG. 6D.

Figure 6H:
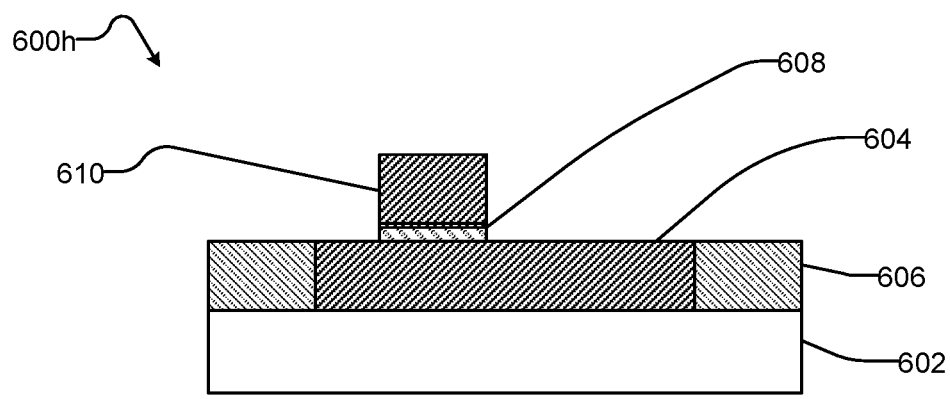

FIG. 6H shows a sectional view of a portion of a superconducting integrated circuit 600*h* at a subsequent stage of the fabrication process. Superconducting integrated circuit 600*h* can be formed from integrated circuit 600*g* by patterning insulating layer 608 and counter electrode 610. This may, for example, include masking and etching insulating layer 608 and counter electrode 610.

Figure 6I:
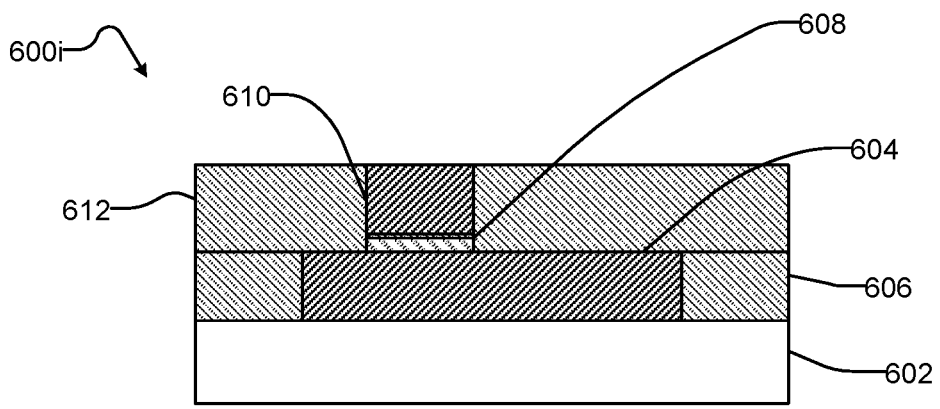

FIG. 6I shows a sectional view of a portion of a superconducting integrated circuit 600*i* at a subsequent stage of the fabrication process. Superconducting integrated circuit 600*i* can be formed from integrated circuit 600*h* by depositing a second dielectric layer 612. In some implementations, second dielectric layer 612 may comprise silicon dioxide. It will be understood that the patterning of insulating layer 608 and counter electrode 610 and deposition of second dielectric layer 612 may occur prior to planarization of counter electrode 610, in a similar manner to the order of steps shown in FIGS. 6A through 6D.

It will be understood that while the stages of fabrication shown in FIG. 6A to 6I are shown as being completed on substrate 602, similar processing steps may be employed at different locations on a superconducting integrated circuit, and multiple similar structures may be formed at varying heights within the circuit.

FIG. 7 is a flowchart illustrating a method 700 for fabricating a portion of a superconducting integrated circuit including planarization of a base electrode layer, in accordance with the present systems and methods. Method 700 includes acts 702-708, though in other implementations, certain acts can be omitted and/or additional acts can be added. Method 700 can be performed by, for example, integrated circuit fabrication equipment in response to an initiation of a fabrication process.

At 702, a base electrode layer is deposited. Base electrode layer may be deposited to overly a substrate in some implementations, or, in other implementations, may be placed over other structures such as other wiring layers and/or dielectric layers. In some implementations, the base electrode layer may be formed of niobium.

At 704, the base electrode layer is planarized to provide a top surface having a lower surface roughness than the surface roughness of the top surface prior to planarizing. In some implementations, planarization may include polishing the base electrode layer back to a smooth surface. In some implementations, the planarization may be a CMP as discussed above.

At 706, an insulating layer is deposited to overlie at least a portion of the base electrode layer. In some implementations, the insulating layer may be a layer of aluminum on which a layer of aluminum oxide is formed. In other implementations, the insulating layer may be formed by direct deposition of aluminum oxide or another insulating material.

At 708, a counter electrode layer is deposited to overlie at least a portion of the base electrode layer and the insulating layer. In some implementations, the counter electrode may be formed of niobium.

It will be understood that other acts or operations may be included in forming the trilayer, as discussed further below with respect to method 800. The counter electrode layer may be planarized after deposition in order to form a surface with reduced surface roughness at the top of the trilayer. Alternatively, after forming the trilayer, the trilayer may be patterned, and a dielectric material may be deposited over and around the trilayer. Planarization may then be performed to polish the dielectric layer back to the top surface of the counter electrode layer, and the dielectric layer and the counter electrode layer may be polished back to form a top surface of the counter electrode layer having reduced surface roughness.

Performing planarization of the base electrode layer prior to deposition of the insulating layer may provide a smoother surface on which to deposit the insulating layer and the counter electrode. In some implementations, the film morphology may be a contributor to the integrity of structures formed, such as when Josephson junctions are formed. CMP may be used to polish the exposed base electrode surface in order to provide an atomically smooth surface prior to deposition of the insulating layer. In some implementations, the counter electrode layer may also be planarized in order to form a surface with reduced surface roughness prior to forming additional structures and electrical connections. For both the base electrode layer and the counter electrode layer, providing a reduced surface roughness of an electrode layer may serve to improve electrical connections formed with that layer by way of the smoothed surface.

FIG. 8 is a flowchart illustrating a method 800 for fabricating a portion of a superconducting integrated circuit including planarization of a base electrode layer, in accordance with the present systems and methods. Method 800 includes acts 802-812, though in other implementations, certain acts can be omitted and/or additional acts can be added. Method 800 can be performed by, for example, integrated circuit fabrication equipment in response to an initiation of a fabrication process.

At 802, a base electrode layer is deposited. Base electrode layer may be deposited to overly a substrate in some implementations, or, in other implementations, may be placed over other structures such as other wiring layers and/or dielectric layers. In some implementations, the base electrode layer may be formed of niobium.

At 804, the base electrode layer is patterned. Patterning the base electrode layer may include masking and etching the base electrode layer.

At 806, a dielectric layer is deposited to overlie at least a portion of the base electrode. The dielectric layer can fill openings around or between elements of the base electrode layer.

At 808, the base electrode layer and the dielectric layer are planarized to provide a top surface having a lower surface roughness than the surface roughness of the top surface prior to planarizing. In some implementations, planarization may include polishing the dielectric layer back to an upper surface of the base electrode layer, and the dielectric layer and the base electrode layer may be polished back to a smooth surface. In some implementations, the planarization may be a CMP as discussed above.

At 810, an insulating layer is deposited to overlie at least a portion of the surface formed by the base electrode layer and the dielectric layer. In some implementations, the insulating layer may be a layer of aluminum on which a layer of aluminum oxide is formed. In other implementations, the insulating layer may be formed by direct deposition of aluminum oxide or another insulating material.

At 812, a counter electrode layer is deposited to overlie at least a portion of the base electrode layer and the insulating layer. In some implementations, the counter electrode may be formed of niobium.

At 814, the counter electrode layer is planarized to provide a top surface having a lower surface roughness, as described at act 808 for the base electrode.

At 816, the counter electrode layer and the insulating layer are patterned. Patterning the counter electrode layer and the insulating layer may include masking and etching the counter electrode layer and the insulating layer.

At 818, a second dielectric layer is deposited. The dielectric layer can fill openings around or between elements formed by the counter electrode layer and the insulating layer. The second dielectric layer may be applied over the counter electrode layer and polished back to the surface of the counter electrode layer. It will also be understood that the second dielectric layer may be applied prior to planarizing the counter electrode, as described with respect to the base electrode at 808. In this implementation, the second dielectric layer will be polished back to expose the upper surface of the counter electrode layer, and then both the second dielectric layer and the counter electrode layer may be polished back to form a top surface of the counter electrode layer having reduced surface roughness.

In view of the teachings of the implementations of methods 700 and 800 as discussed herein, it will be understood that the order of the acts or operations may be varied. For example, in method 800, the base electrode layer may be planarized prior to being patterned and prior to the first dielectric layer being deposited. The surface roughness of the base electrode layer may be reduced prior to patterning and depositing of the first dielectric layer, and it may only be required to polish the first dielectric layer back to the surface of the base electrode layer.

Performing planarization of the base electrode layer and the dielectric layer prior to subsequent deposition acts may advantageously provide a smoother surface on which to deposit the insulating layer and the counter electrode. Similarly, performing planarization of the counter electrode layer may advantageously improve electrical connection to subsequent structures. Providing a reduced surface roughness of an electrode layer may serve to improve electrical connections formed with that layer by way of the smoothed surface. In some implementations, the film morphology may be a contributor to the integrity of structures formed, such as when Josephson junctions are formed. CMP may be used to polish the exposed base electrode surface in order to provide an atomically smooth surface prior to deposition of the insulating layer.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. patent application Ser. No. 16/681,431, U.S. Provisional Patent Application No. 62/760,253, U.S. Pat. Nos. 7,876,248, 8,035,540, 8,098,179, 10,454,015, US Patent Publication No. 2018/0219150, and U.S. patent application Ser. No. 16/029,026.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A quantum processor comprising:
a first superconductive programmable device comprising a first type of material that has a respective critical temperature at which the first type of material superconducts, the respective critical temperature of the first type of material being an intrinsic property of the first type of material, the first superconductive programmable device comprising at least one first superconducting wiring layer and a first Josephson junction, the at least one first superconducting wiring layer comprising one or more first superconducting traces, and each of the at least one first superconducting wiring layer and the first Josephson junction comprising the first type of material;
a second superconductive device comprising a second type of material that has a respective critical temperature at which the second type of material superconducts, the respective critical temperature of the second type of material being an intrinsic property of the second type of material, the respective critical temperature of the second type of material being different from the respective critical temperature of the first type of material, the second superconductive device comprising at least one second superconducting wiring layer, the at least one second superconducting wiring layer comprising one or more second superconducting traces comprising the second type of material, and the first superconductive programmable device is more susceptible to noise than the second superconductive device; and
an insulative dielectric, the insulative dielectric separating at least a portion of the first superconductive programmable device from at least a portion of the second superconductive device.

2. The quantum processor of claim 1, wherein the first superconductive programmable device comprises one of a qubit or a coupler.

3. The quantum processor of claim 1, wherein the second superconductive device comprises one of a magnetometer, a transformer, an on-chip shield, and a readout control system.

4. The quantum processor of claim 1, wherein the first type of material comprises aluminum and the second type of material comprises niobium.

5. The quantum processor of claim 1, further comprising a passivation layer separating the first superconducting programmable device from the second superconducting device.

6. A quantum processor comprising:
a first portion comprising one or more first wiring layers comprising a first type of material that has a respective critical temperature at which the first type of material superconducts, the respective critical temperature of the first type of material being an intrinsic property of the first type of material;
a second portion comprising one or more second wiring layers comprising a second type of material that has a respective critical temperature at which the second type of material superconducts, the respective critical temperature of the second type of material being an intrinsic property of the second type of material, the respective critical temperature of the second type of material being different from the respective critical temperature of the first type of material being, the second portion distinct from the first portion;
a first superconductive programmable device comprising wiring in the first portion and a first Josephson junction, the wiring in the first portion comprising one or more first superconducting traces; and
a second superconductive device comprising wiring in the second portion, the wiring in the second portion comprising one or more second superconducting traces, and the first superconductive device is more susceptible to noise than the second superconductive device.

7. The quantum processor of claim 6, wherein the one or more first wiring layers comprise analog circuitry.

8. The quantum processor of claim 6, wherein the first superconductive programmable device comprises one of a qubit or a coupler.

9. The quantum processor of claim 6, wherein the second superconductive device comprises one of a magnetometer, a transformer, an on-chip shield, and a readout control system.

10. The quantum processor of claim 6, wherein the first type of material comprises aluminum and the second type of material comprises niobium.

11. The quantum processor of claim 6, wherein an interface of the first portion and the second portion comprises a gradient of critical temperatures between the critical temperature of the first type of material and the critical temperature of the second type of material.

12. The quantum processor of claim 6, further comprising a passivation layer interposed between the first portion and the second portion.

13. The quantum processor of claim 6, wherein the second portion overlies the first portion.

14. The quantum processor of claim 6, wherein the first portion overlies the second portion.

15. The quantum processor of claim 6, further comprising a third portion comprising one or more additional wiring layers, the first portion being interposed between the second portion and the third portion.

16. The quantum processor of claim 6, further comprising a substrate, the first portion and the second portion overlying the substrate.

17. The quantum processor of claim 16, wherein the second portion overlies the substrate, and the first portion overlies the second portion.

18. The quantum processor of claim 6, wherein the first portion comprises at least two wiring layers and the second portion comprises at least two wiring layers.

* * * * *